(12) United States Patent
Hamamoto et al.

(10) Patent No.: US 10,175,394 B2
(45) Date of Patent: Jan. 8, 2019

(54) SUBSTRATE WITH MULTILAYER REFLECTIVE FILM, MASK BLANK, TRANSFER MASK AND METHOD OF MANUFACTURING SEMICONDUCTOR DEVICE

(71) Applicant: HOYA CORPORATION, Shinjuku-ku, Tokyo (JP)

(72) Inventors: Kazuhiro Hamamoto, Tokyo (JP); Toshihiko Orihara, Tokyo (JP)

(73) Assignee: HOYA CORPORATION, Shinjuku-ku, Tokyo (JP)

( * ) Notice: Subject to any disclaimer, the term of this patent is extended or adjusted under 35 U.S.C. 154(b) by 0 days.

(21) Appl. No.: 15/705,304

(22) Filed: Sep. 15, 2017

(65) Prior Publication Data

US 2018/0067238 A1    Mar. 8, 2018

Related U.S. Application Data

(63) Continuation of application No. 14/901,575, filed as application No. PCT/JP2014/075379 on Sep. 25, 2014, now Pat. No. 9,798,050.

(30) Foreign Application Priority Data

Sep. 27, 2013    (JP) .............................. 2013-202493

(51) Int. Cl.
*G03B 27/32* (2006.01)
*G02B 5/08* (2006.01)
(Continued)

(52) U.S. Cl.
CPC ......... *G02B 5/0816* (2013.01); *G02B 5/0891* (2013.01); *G02B 5/26* (2013.01);
(Continued)

(58) Field of Classification Search
CPC ........ G02B 1/14; G02B 5/003; G02B 5/0816; G02B 5/0891; G02B 5/26; G02B 5/285;
(Continued)

(56) References Cited

U.S. PATENT DOCUMENTS 7,998,645 B2    8/2011 Otsuka et al.
8,460,843 B2    6/2013 Otsuka et al.
(Continued)

FOREIGN PATENT DOCUMENTS

JP    2001-239459 A    9/2001
JP    2006-176341 A    7/2006
(Continued)

OTHER PUBLICATIONS

International Search Report for PCT/JP2014/075379 dated Dec. 16, 2014.

*Primary Examiner* — Peter B Kim
(74) *Attorney, Agent, or Firm* — Sughrue Mion, PLLC

(57) ABSTRACT

A substrate with multilayer reflective film for discovery of critical defects by inhibiting the detection of pseudo defects attributable to surface roughness of a substrate or film using a highly sensitive defect inspection apparatus. The substrate has a multilayer reflective film obtained by alternately laminating a high refractive index layer and a low refractive index layer on a main surface of a mask blank substrate used in lithography, wherein an integrated value I of the power spectrum density (PSD) at a spatial frequency of 1 $\mu m^{-1}$ to 10 $\mu m^{-1}$ of the surface of the substrate with a multilayer reflective film, obtained by measuring a region measuring 3 $\mu m \times 3$ $\mu m$ with an atomic force microscope, is not more than $180 \times 10^{-3}$ $nm^3$, and the maximum value of the rower spectrum density (PSD) at a spatial frequency of 1 $\mu m^{-1}$ to 10 $\mu m^{-1}$ is not more than 50 $nm^4$.

9 Claims, 4 Drawing Sheets

(51) Int. Cl.
    *G03F 1/24* (2012.01)
    *G02B 5/26* (2006.01)
    *G02B 5/28* (2006.01)
    *G03F 1/52* (2012.01)
    *G03F 1/84* (2012.01)
    *G03F 7/20* (2006.01)
    G02B 1/14 (2015.01)
    G02B 5/00 (2006.01)

(52) U.S. Cl.
    CPC ............... *G02B 5/285* (2013.01); *G03F 1/24* (2013.01); *G03F 1/52* (2013.01); *G03F 1/84* (2013.01); *G03F 7/70216* (2013.01); *G02B 1/14* (2015.01); *G02B 5/003* (2013.01)

(58) Field of Classification Search
    CPC ..... G03F 1/24; G03F 1/22; G03F 1/50; G03F 1/52; G03F 1/84; G03F 7/70216
    See application file for complete search history.

(56) References Cited

U.S. PATENT DOCUMENTS

| | | |
|---|---|---|
| 2005/0118533 A1 | 6/2005 | Mirkarimi et al. |
| 2007/0077499 A1 | 4/2007 | Ikuta et al. |
| 2011/0281069 A1 | 11/2011 | Otsuka et al. |

FOREIGN PATENT DOCUMENTS

| | | |
|---|---|---|
| JP | 2008-094649 A | 4/2008 |
| JP | 2008-156215 A | 7/2008 |
| JP | 2009-510711 A | 3/2009 |
| WO | 2013/084978 A1 | 6/2013 |

SUBSTRATE WITH MULTILAYER REFLECTIVE FILM, MASK BLANK, TRANSFER MASK AND METHOD OF MANUFACTURING SEMICONDUCTOR DEVICE

CROSS REFERENCE TO RELATED APPLICATIONS

This is a Continuation of application Ser. No. 14/901,575 filed Dec. 28, 2015, claiming priority based on International Application No. PCT/JP2014/075379 filed Sep. 25, 2014, claiming priority based on Japanese Patent Application No. 2013-202493 filed Sep. 27, 2013, the contents of all of which are incorporated herein by reference in their entirety.

TECHNICAL FIELD

The present invention relates to a substrate with a multilayer reflective film, which is able to facilitate the discovery of contaminants or scratches and other critical defects by inhibiting pseudo defects attributable to surface roughness of a substrate or film in a defect inspection using a highly sensitive defect inspection apparatus, a mask blank, a transfer mask and a method of manufacturing a semiconductor device.

BACKGROUND ART

Accompanying the increasingly higher levels of integration of semiconductor devices in the semiconductor industry in recent years, there is a need for fine patterns that exceed the transfer limitations of conventional photolithographic methods using ultraviolet light. Extreme ultraviolet (EUV) lithography is considered to be promising as an exposure technology that uses EUV light to enable the formation of such fine patterns. Here, EUV light refers to light in the wavelength band of the soft X-ray region or vacuum ultraviolet region, and more specifically, light having a wavelength of about 0.2 nm to 100 nm. Reflective masks have been proposed as transfer masks for use in EUV lithography. Such reflective masks have a multilayer reflective film that reflects exposure light formed on a substrate, and an absorber film that absorbs exposure light formed in a pattern on the multilayer reflective film.

The reflective mask is fabricated from a substrate, a multilayer reflective film formed on the substrate, and a reflective mask blank having an absorber film formed on the multilayer reflective film, by forming an absorber film pattern by photolithography and the like.

As described above, due to the growing demand for miniaturization in the lithography process, significant problems are being encountered in the lithography process. One of these is the problem relating to defect information of mask blank substrates and substrates with a multilayer reflective film and the like used in the lithography process.

Mask blank substrates are being required to have even higher smoothness from the viewpoints of improving defect quality accompanying the miniaturization of patterns in recent years and the optical properties required of transfer masks.

In addition, substrates with a multilayer reflective film are also being required to have even higher smoothness from the viewpoints of improving defect quality accompanying the miniaturization of patterns in recent years and the optical properties required of transfer masks. Multilayer reflective films are formed by alternately laminating layers having a high refractive index and layers having a low refractive index on the surface of a mask blank substrate. Each of these layers is typically formed by sputtering using sputtering targets composed of the materials that form these layers.

Ion beam sputtering is preferably carried out as the sputtering method from the viewpoint of being resistant to contamination by impurities present in the multilayer reflective film as a result of not requiring the generation of plasma by electrical discharge, and having an independent ion source thereby making setting of conditions comparatively easy. In the case of using ion beam sputtering, from the viewpoint of the smoothness and surface uniformity of each layer formed, the high refractive index layer and low refractive index layer are deposited by allowing sputtered particles to reach the target at a large angle with respect to the normal (line perpendicular to a main surface of the mask blank substrate) of a main surface of the mask blank substrate, or in other words, at an angle diagonal or nearly parallel to a main surface of the substrate.

Patent Literature 1 describes a technology for manufacturing a substrate with a multilayer reflective film using such a method in which, when depositing a multilayer reflective film of a reflective mask blank for EUV lithography on a substrate, ion beam sputtering is carried out by maintaining the absolute value of an angle α formed between the normal of the substrate and sputtered particles entering the substrate such that 35 degrees≤α≤80 degrees while rotating the substrate about the central axis thereof.

PRIOR ART LITERATURE

Patent Literature

Patent Literature 1: JP 2009-510711A

DISCLOSURE OF THE INVENTION

Problems to be Solved by the Invention

Accompanying the rapid pace of pattern miniaturization in lithography using

EUV light, the defect size of reflective masks in the form of EUV masks is becoming increasingly smaller year by year. The inspection light source wavelengths used during defect inspections in order to discover such fine defects are approaching the light source wavelength of the exposure light.

For example, highly sensitive defect inspection apparatuses employing an inspection wavelength of 266 nm (such as the "MAGICS M7360" Mask/Substrate/Blank Defect Inspection Apparatus for EUV Exposure manufactured by Lasertec Corp.), an inspection wavelength of 193 nm (such as the "Teron 610" of "Teron 600 Series" of Reticule, Optical Mask/Blank and UV Mask/Blank Defect Inspection Apparatuses manufactured by KLA-Tencor Corp.), or an inspection wavelength of 13.5 nm, are being used or proposed increasingly frequently as defect inspection apparatuses of EUV masks and masters thereof in the form EUV mask blanks, substrates with a multilayer reflective film and substrates.

In addition, in the case of multilayer reflective films of substrates with a multilayer reflective film used in conventional EUV masks, attempts have been made to reduce concave defects present on the substrate by depositing according to, for example, the method described in Patent Literature 1. However, no matter how much defects attributable to concave defects in the substrate are reduced, due to the high detection sensitivity of the aforementioned highly sensitive defect detection apparatuses, there is still the problem of the number of defects detected (number of detected defects=number of critical defects+number of pseudo defects) being excessively large when the multilayer reflective film is inspected for defects.

Pseudo defects as mentioned here refer to surface irregularities that do not have an effect on pattern transfer and are permitted to be present on a multilayer reflective film, and end up being incorrectly assessed as defects when inspected with a highly sensitive defect inspection apparatus. If a large number of such pseudo defects are detected in a defect inspection, critical defects that do affect pattern transfer end up being concealed by the large number of pseudo defects, thereby preventing the discovery of critical defects. For example, with currently popular defect inspection apparatuses employing an inspection light source wavelength of 266 nm, 193 nm or 13.5 nm, the number of defects detected in a defect inspection region (measuring, for example, 132 mm×132 mm) ends up exceeding 50,000 defects in measurement of a substrate or substrate with a multilayer reflective film having a size of, for example, 152 mm×152 mm, thereby obstructing inspections for the presence of critical defects. Overlooking critical defects in a defect inspection results in defective quality in the subsequent semiconductor device volume production process and leads to unnecessary labor and economic losses.

In view of the foregoing, an object of the present invention is to provide a substrate with a multilayer reflective film, which is able to facilitate discovery of contaminants or scratches and other critical defects by inhibiting detection of pseudo defects attributable to surface roughness of a substrate or film in a defect inspection using a highly sensitive defect inspection apparatus, a reflective mask blank, and a method of manufacturing a semiconductor device.

In addition, an object of the present invention is to provide a substrate with a multilayer reflective film, which enables critical defects to be reliably detected since the number of detected defects, including pseudo defects, is reduced even when using highly sensitive defect inspection apparatuses that use light of various wavelengths, and achieves smoothness required by substrates having a multilayer reflective film in particular while simultaneously reducing the number of detected defects, including pseudo defects, a reflective mask blank obtained by using that substrate with a multilayer reflective film, and a semiconductor device that uses that reflective mask blank.

Means for Solving the Problems

As a result of conducting extensive studies to solve the aforementioned problems, the inventors of the present invention found that the roughness of a prescribed spatial frequency (or spatial wavelength) component affects the inspection light source wavelength of a highly sensitive defect inspection apparatus. Therefore, by specifying the spatial frequency of a roughness component at which a highly sensitive defect inspection apparatus ends up incorrectly assessing a defect as a pseudo defect among roughness (surface irregularity) components on the surface of a film (such as an absorber film) formed on a main surface of a substrate, and managing amplitude intensity at that spatial frequency, the detection of pseudo defects in a defect inspection can be inhibited and critical defects can be made more conspicuous.

In addition, although attempts have previously been made to reduce the surface roughness of substrates with a multilayer reflective film from the viewpoint of reflectance properties, there is no known correlation whatsoever with the detection of pseudo defects by highly sensitive defect inspection apparatuses.

Therefore, the present invention has the configurations indicated below in order to solve the aforementioned problems.

The present invention is a substrate with a multilayer reflective film characterized by the following Configurations 1 to 5, a reflective mask blank characterized by the following Configurations 6 to 8, a reflective mask characterized by the following Configuration 9, and a method of manufacturing a semiconductor device characterized by the following Configuration 10.

(Configuration 1)

Configuration 1 of the present invention is a substrate with a multilayer reflective film, comprising: a multilayer reflective film obtained by alternately laminating a high refractive index layer and a low refractive index layer on or above a main surface of a mask blank substrate used in lithography; wherein, an integrated value I of the power spectrum density (PSD) at a spatial frequency of 1 $\mu m^{-1}$ to 10 $\mu m^{-1}$ of the surface of the substrate with a multilayer reflective film, obtained by measuring a region measuring 3 $\mu m \times 3$ $\mu m$ with an atomic force microscope, is not more than 180×10$^{-3}$ nm$^3$, and the maximum value of the power spectrum density (PSD) at a spatial frequency of 1 $\mu m^{-1}$ to 10 $\mu m^{-1}$ is not more than 50 nm$^4$.

According to Configuration 1, by making the integrated value I of the power spectrum density (PSD) at a spatial frequency of 1 $\mu m^{-1}$ to 10 $\mu m^{-1}$, obtained by measuring a region measuring 3 $\mu m \times 3$ $\mu m$ on the surface of a reflective mask blank, to be not more than 180×10$^{-3}$, and making the maximum value of the power spectrum density (PSD) at a spatial frequency of 1 $\mu m^{-1}$ to 10 $\mu m^{-1}$ to be not more than 50 nm$^4$, detection of pseudo defects in a defect inspection, using a highly sensitive defect inspection apparatus having an inspection wavelength of the defect inspection light source of 150 nm to 365 nm, can be inhibited while making critical defects more conspicuous. Moreover, detection of pseudo defects under a plurality of levels of inspection sensitivity conditions, using a highly sensitive defect inspection apparatus having an inspection wavelength of the defect inspection light source of 150 nm to 365, can also be inhibited while making critical defects more conspicuous.

(Configuration 2)

Configuration 2 of the present invention is the substrate with a multilayer reflective film as described in Configuration 1, wherein the integrated value I of the power spectrum density (PSD) at a spatial frequency of 1 $\mu m^{-1}$ to 5 $\mu m^{-1}$ of the surface of the substrate with a multilayer reflective film, obtained by measuring a region measuring 3 $\mu m \times 3$ $\mu m$ with an atomic force microscope, is not more than 115×10$^{-3}$ nm$^3$.

According to Configuration 2, detection of pseudo defects in a defect inspection, using a highly sensitive defect inspection apparatus having an inspection wavelength of the defect inspection light source of 150 nm to 365 nm, can be inhibited while making critical defects more conspicuous.

(Configuration 3)

Configuration 3 of the present invention is the substrate with a multilayer reflective film as described in Configuration 1 or Configuration 2, wherein the power spectrum density at a spatial frequency of 1 $\mu m^{-1}$ to 10 $\mu m^{-1}$ has the characteristic of an overall monotonic decrease.

As shown in FIG. 7, for example, "overall monotonic decrease" refers to a gradual decrease in power spectrum density such that an approximation curve approaches a high spatial frequency of 10 µm$^{-1}$ from a low spatial frequency of 1 µm$^{-1}$ when the relationship between spatial frequency and power spectrum density is approximated by a prescribed approximation curve. In the example shown in FIG. 7, a power approximation is used for the approximation curve.

According to Configuration 3, as a result of power spectrum density over a prescribed spatial frequency range having the characteristic of an overall monotonic decrease, detection of pseudo defects in a defect inspection using a highly sensitive defect inspection apparatus can be further inhibited while making critical defects even more conspicuous.

(Configuration 4)

Configuration 4 of the present invention is a substrate with a multilayer reflective film, comprising: a multilayer reflective film obtained by alternately laminating a high refractive index layer and a low refractive index layer on or above a main surface of a mask blank substrate used in lithography; wherein, an integrated value I of the power spectrum density (PSD) at a spatial frequency of 10 µm$^{-1}$ to 100 µm$^{-1}$ of the surface of the substrate with a multilayer reflective film, obtained by measuring a region measuring 1 µm×1 µm with an atomic force microscope, is not more than 150×10$^{-3}$ nm$^3$, and the maximum value of the power spectrum density (PSD) at a spatial frequency of 10 µm$^{-1}$ to 100 µm$^{-1}$ is not more than 9 nm$^4$.

According to Configuration 4, by making the integrated value I of the power spectrum density (PSD) at a spatial frequency of 10 µm$^{-1}$ to 100 µm$^{-1}$, obtained by measuring a region measuring 1 µm×1 µm on the surface of a reflective mask blank, to be not more than 150×10$^{-3}$ nm$^3$, and making the maximum value of the power spectrum density (PSD) at a spatial frequency of 10 µm$^{-1}$ to 100 µm$^{-1}$ to be not more than 9 nm$^4$, the detection of pseudo defects in a defect inspection using a highly sensitive defect inspection apparatus having an inspection wavelength of the defect inspection light source of 0.2 nm to 100 nm can be inhibited while making critical defects more conspicuous. Moreover, detection of pseudo defects under a plurality of levels of inspection sensitivity conditions using a highly sensitive defect inspection apparatus having an inspection wavelength of the defect inspection light source of 0.2 nm to 100 nm can also be inhibited while making critical defects more conspicuous.

(Configuration 5)

Configuration 5 of the present invention is the substrate with a multilayer reflective film as described in Configuration 4, wherein the power spectrum density at a spatial frequency of 10 µm$^{-1}$ to 100 µm$^{-1}$ has the characteristic of an overall monotonic decrease.

Furthermore, the overall monotonic decrease referred to here has the same meaning as previously described, and as shown in FIG. 8, for example, refers to a gradual decrease in power spectrum density such that an approximation curve approaches a high spatial frequency of 100 µm$^{-1}$ from a low spatial frequency of 10 µm$^{-1}$ when the relationship between spatial frequency and power spectrum density is approximated by a prescribed approximation curve. In the example shown in FIG. 8, a power approximation is used for the approximation curve.

According to Configuration 5, the detection of pseudo defects in a defect inspection using a highly sensitive defect inspection apparatus can be further inhibited while making critical defects even more conspicuous.

(Configuration 6)

Configuration 6 of the present invention is the substrate with a multilayer reflective film as described in any of Configurations 1 to 5, wherein a protective film is provided on or above the multilayer reflective film.

According to Configuration 6, because damage to the surface of the multilayer reflective film can be inhibited when fabricating a transfer mask (EUV mask) as a result of the substrate with a multilayer reflective film having a protective film on or above the multilayer reflective film, reflectance properties with respect to EUV light can be further improved. In addition, in a substrate with a multilayer reflective film, detection of pseudo defects in a defect inspection of the surface of the protective film using a highly sensitive defect inspection apparatus can be inhibited and critical defects can be made to be more conspicuous.

(Configuration 7)

Configuration 7 of the present invention is a reflective mask blank comprising an absorber film serving as a transfer pattern on or above the multilayer reflective film or the protective film of the substrate with a multilayer reflective film as described in any of Configurations 1 to 6.

As a result of having an absorber film serving as a transfer pattern on or above the multilayer reflective film or the protective film of the substrate with a multilayer reflective film, a reflective mask blank can be obtained in which detection of pseudo defects in a defect inspection using a highly sensitive defect inspection apparatus can be inhibited and critical defects can be made to be more conspicuous.

(Configuration 8)

Configuration 8 of the present invention is a reflective mask blank comprising: a multilayer reflective film, obtained by alternately laminating a high refractive index layer and a low refractive index layer on or above a main surface of a mask blank substrate used in lithography, and an absorber film; wherein, an integrated value I of the power spectrum density (PSD) at a spatial frequency of 1 µm$^{-1}$ to 10 µm$^{-1}$ of the surface of the absorber film, obtained by measuring a region measuring 3 µm×3 µm with an atomic force microscope, is not more than 800×10$^{-3}$ nm$^3$, and the maximum value of the power spectrum density (PSD) at a spatial frequency of 1 µm$^{-1}$ to 10 µm$^{-1}$ is not more than 50 nm$^4$.

According to the reflective mask blank of Configuration 8, a reflective mask blank can be obtained in which detection of pseudo defects in a defect inspection using a highly sensitive defect inspection apparatus can be inhibited and critical defects can be made to be more conspicuous.

(Configuration 9)

Configuration 9 of the present invention is a reflective mask comprising: an absorber pattern on or above the multilayer reflective film or the protective film by patterning the absorber film in the reflective mask blank as described in Configuration 7 or Configuration 8.

According to the reflective mask of Configuration 9, detection of pseudo defects in a defect inspection using a highly sensitive defect inspection apparatus can be inhibited and critical defects can be made to be more conspicuous.

(Configuration 10)

Configuration 10 of the present invention is a method of manufacturing a semiconductor device comprising a step for forming a transfer pattern on or above a transferred substrate by carrying out a lithography process with an exposure apparatus using the reflective mask as described in Configuration 9.

According to the method of manufacturing a semiconductor device of Configuration 10, because a reflective mask from which contaminants, scratches and other critical defects have been removed can be used in a defect inspection using a highly sensitive defect inspection apparatus, a circuit pattern or other transfer pattern transferred to a resist film formed on or above a transferred substrate such as a semiconductor substrate is free of defects, and a semiconductor device can be fabricated that has a fine and highly precise transfer pattern.

Effects of the Invention

According to the substrate with a multilayer reflective film, reflective mask blank and reflective mask of the present invention as previously described, the discovery of contaminants, scratches or other critical defects can be facilitated by inhibiting detection of pseudo defects attributable to surface roughness of a substrate or film in a defect inspection using a highly sensitive defect inspection apparatus. In a substrate with a multilayer reflective film, reflective mask blank and reflective mask used in EUV lithography in particular, a multilayer reflective film formed on a main surface of a substrate is obtained that exhibits high reflectance while inhibiting pseudo defects.

In addition, according to the method of manufacturing a semiconductor device as previously described, because a reflective mask from which contaminants, scratches and other critical defects have been removed can be used in a defect inspection using a highly sensitive defect inspection apparatus, a circuit pattern or other transfer pattern formed on a transferred substrate such as a semiconductor substrate is free of defects, and a semiconductor device can be fabricated that has a fine and highly precise transfer pattern.

DETAILED DESCRIPTION OF THE INVENTION

The present invention is a substrate with a multilayer reflective film having a mask blank multilayer film obtained by alternately laminating a high refractive index layer and a low refractive index layer on or above a main surface of a mask blank substrate used in lithography. In addition, the present invention is a reflective mask blank comprising a multilayer reflective film, obtained by alternately laminating a high refractive index layer and a low refractive index layer on or above a main surface of a mask blank substrate used in lithography, and an absorber film. The substrate with a multilayer reflective film and reflective mask blank of the present invention can be used to fabricate a reflective mask used in EUV lithography.

Figure 2:
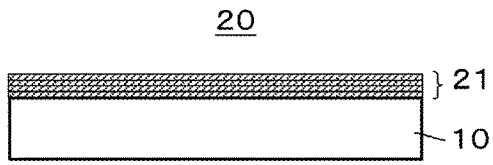
FIG. 2 is a cross-sectional schematic diagram showing one example of the configuration of a substrate with a multilayer reflective film according to one embodiment of the present invention.

FIG. 2 is a schematic diagram of one example of a substrate with a multilayer reflective film 20 of the present invention. The substrate with a multilayer reflective film 20 of the present invention has a multilayer reflective film 21 on or above a main surface of a mask blank substrate 10. The substrate with a multilayer reflective film 20 of the present invention may further comprise a protective film 22 on or above the multilayer reflective film 21. A reflective mask blank 30 shown in FIG. 3 can be obtained by further forming an absorber film 24 on or above the substrate with a multilayer reflective film 20 of the present invention. A reflective mask 40 shown in FIG. 4 can be fabricated by forming an absorber pattern 27 by patterning the absorber film 24 of the reflective mask blank 30 shown in FIG. 3.

The surfaces of the substrate with a multilayer reflective film 20 and the reflective mask blank 30 of the present invention are characterized in that an integrated value I and maximum value of the power spectrum density (PSD) over a prescribed spatial frequency range, obtained by measuring a region of a prescribed size with an atomic force microscope, fall within a prescribed range. In the substrate with a multilayer reflective film 20 and the reflective mask blank 30 of the present invention, the discovery of contaminants, scratches and other critical defects can be facilitated by inhibiting the detection of pseudo defects attributable to the surface roughness of a substrate and film in a defect inspection using a highly sensitive defect inspection apparatus.

[Power Spectrum Analysis]

In the present invention, in order to achieve the aforementioned object, the surface of the substrate with a multilayer reflective film 20 and/or the reflective mask blank 30 is characterized by having a certain surface roughness and power spectrum density (PSD).

The following provides an explanation of parameters indicating the surface morphology of the surfaces of the substrate with a multilayer reflective film 20 and the reflective mask blank 30 of the present invention in the form surface roughness (Rmax, RMS) and power spectrum density (PSD).

First, RMS (root mean square), which is a typical indicator of surface roughness, refers to root mean square roughness and is the square root of the value obtained by averaging the squares of the deviation from an average line to a measurement curve. RMS is represented by the following formula (1):

[Equation 1]

$$Rms = \sqrt{\frac{1}{l}\int_0^l Z^2(x)dx} \quad (1)$$

wherein, l represents a reference length and Z represents the height from the average line to the measurement curve.

Similarly, Rmax, which is also a typical indicator of surface roughness, is the maximum height of surface roughness, and is the difference between the absolute values of the maximum value of peak height and the maximum value of trough depth on a roughness curve.

RMS and Rmax have conventionally been used to manage the surface roughness of the mask blank substrate 10, and are superior with respect to enabling surface roughness to be ascertained in terms of numerical values. However, because RMS and Rmax both only consist of information relating to height, they do not provide information relating to subtle changes in surface morphology.

In contrast, power spectrum analysis, which represents surface roughness with an amplitude intensity at a spatial frequency by converting surface irregularities of the resulting surface to spatial frequency regions, enables quantification of subtle changes in surface morphology. When Z(x,y) is taken to represent height data at an x coordinate and y coordinate, then the Fourier transformation thereof is given by the following equation (2).

[Equation 2]

$$F(u, v) = \frac{1}{N_x N_y} \sum_{u=0}^{N_x-1} \sum_{v=0}^{N_y-1} Z(x, y)\exp\left[-i2\pi\left(\frac{ux}{N_x} + \frac{vy}{N_y}\right)\right] \quad (2)$$

Here, $N_x$ and $N_y$ represent the number of data sets in the x direction and y direction. u represents 0, 1, 2, ... Nx−1, v represents 0, 1, 2 ... Ny−1, and spatial frequency f at this time is given by the following equation (3).

[Equation 3]

$$f = \left\{\left[\frac{u}{(N_x - 1)d_x}\right]^2 + \left[\frac{v}{(N_y - 1)d_y}\right]^2\right\}^{1/2} \quad (3)$$

Here, in equation (3), $d_x$ represents the minimum resolution in the x direction while $d_y$ represents the minimum resolution in the y direction.

Power spectrum density PSD at this time is given by the following equation (4).

[Equation 4]

$$P(u,v)=|F(u,v)|^2 \quad (4)$$

This power spectrum analysis is superior in that it not only makes it possible to ascertain changes in the surface morphology of a main surface 2 of the substrate 10, the substrate with a multilayer reflective film 20 and a film such as the reflective mask blank 30 as simple changes in height, but also as changes at that spatial frequency, and enables analysis of the effects of microscopic reactions and the like on the surface at the atomic level.

An integrated value I of power spectrum density (PSD) can be used in the case of evaluating the surface morphology of the substrate with a multilayer reflective film 20 and the reflective mask blank 30 by power spectrum analysis. The integrated value I refers to an area over the range of a prescribed spatial frequency depicted by the value of power spectrum density (PSD) relative to spatial frequency as exemplified in FIG. 5, and is defined as shown in equation (5).

[Equation 5]

$$I = \sum_i (f_{i+1} - f_i)P(f_i) \quad (5)$$

[Equation 6]

$$f_i = \frac{i}{X'}, i = 1, 2, \ldots \frac{N'}{2} \quad (6)$$

Spatial frequency f is defined in the manner of equation (3), and power spectrum density is fundamentally calculated as a function of spatial frequency determined by the values of u and v. Here, in order to calculate power spectrum density for a discrete spatial frequency, spatial frequency $f_i$ is defined in the manner of equation (6) when the measured region and number of data points are equal in the x direction and y direction. Here, X' and N' represent the measured region and number of data points. $P(f_i)$ is the power spectrum density at spatial frequency $f_i$.

In the present invention, when measuring a region of a prescribed size, such as a region measuring 3 μm×3 μm, in order to analyze a power spectrum, the measured region may be any arbitrary location of a region where a transfer pattern is formed. In the case the size of the mask blank substrate 10 is that of a 6025 plate (152 mm×152 mm×6.35 mm), then the transfer pattern formation region can be, for example, a region measuring 142 mm×142 mm, a region measuring 132 mm×132 mm or a region measuring 132 mm×104 mm obtained by excluding the peripheral region of the surface of the reflective mask blank 30. In addition, the aforementioned arbitrary location may be a region located in the center of the surface of the reflective mask blank 30, for example.

In addition, the previously described 3 μm×3 μm region, the transfer pattern formation region, and the arbitrary location may also be applied to the mask blank substrate 10 and the absorber film 24 of the reflective mask blank 30.

As a result of making the surface roughness and power spectrum density of a main surface fall within the ranges described above, the detection of pseudo defects can be significantly inhibited in a defect inspection by, for example, the "MAGICS M7360" Mask/Substrate/Blank Defect Inspection Apparatus for EUV Exposure manufactured by Lasertec Corp. (inspection light source wavelength: 266 nm), or the "Teron 600 Series" of Reticle, Optical Mask/Blank and UV Mask/Blank Defect Inspection Apparatuses manufactured by KLA-Tencor Corp. (such as the "Teron 610", inspection light source wavelength: 193 nm).

Furthermore, the aforementioned inspection light source wavelength is not limited to 266 nm and 193 nm. A wavelength of 532 nm, 488 nm, 364 nm and/or 257 nm may also be used as the inspection light source wavelength.

When carrying out a defect inspection on a main surface of the aforementioned mask blank substrate 10 using a highly sensitive defect inspection apparatus using inspection light in the wavelength region of 0.2 nm to 100 nm (EUV light), such as a highly sensitive defect inspection apparatus using EUV light having an inspection light source wavelength of 13.5 nm, the power spectrum density at a spatial frequency of 10 μm$^{-1}$ to 100 μm$^{-1}$ of the aforementioned main surface, obtained by measuring a 1 μm×1 μm region with an atomic force microscope, is preferably not more than 5 nm$^4$, and the power spectrum density at a spatial frequency of 10 μm$^{-1}$ to 100 μm$^{-1}$ is more preferably 0.5 nm$^4$ to 5 nm$^4$. However, when carrying out a defect inspection on a main surface of the mask blank substrate 10 using a highly sensitive defect inspection apparatus using EUV light, this is limited to the case of a material other than glass, because a minimum prescribed reflectance is required.

As a result of making the surface roughness and power spectrum density of a main surface fall within the ranges described above, the detection of pseudo defects can be significantly inhibited in a defect inspection by, for example, a highly sensitive defect inspection apparatus using EUV light having a wavelength of 13.5 nm for the inspection light source wavelength.

[Mask Blank Substrate 10]

Next, an explanation is provided of the mask blank substrate 10 used in one embodiment of the present invention.

Figure 1A:
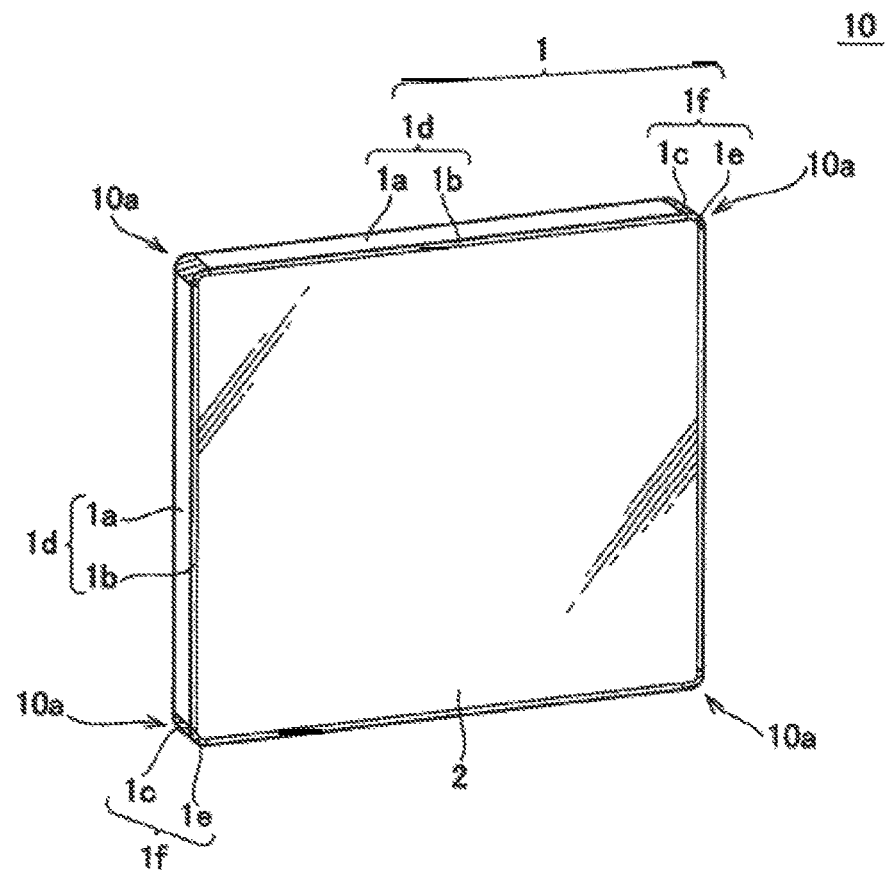
FIG. 1A is a perspective view showing a mask blank substrate according to one embodiment of the present invention.
Figure 1B:
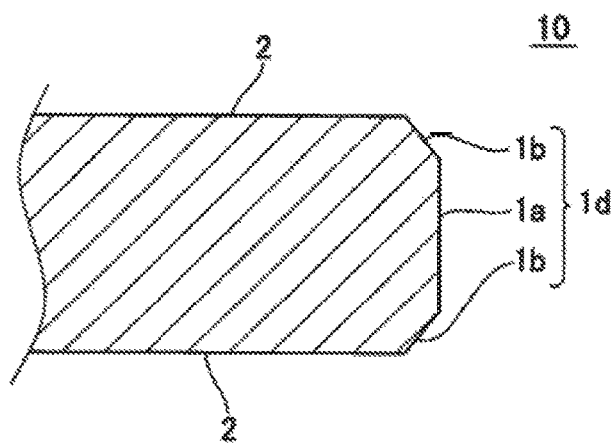
FIG. 1B is a cross-sectional schematic diagram showing a mask blank substrate of the embodiment.

FIG. 1(a) is a perspective view showing the mask blank substrate 10 of the present embodiment. FIG. 1(b) is a cross-sectional schematic diagram of the mask blank substrate 10 of the present embodiment.

The mask blank substrate 10 (which may be simply referred to as the substrate 10) is a rectangular plate-like body, and has two opposing main surfaces 2 and an edge face 1. The two opposing main surfaces 2 constitute an upper surface and a lower surface of this plate-like body, and are formed so as to be mutually opposed. In addition, at least one of the two opposing main surfaces 2 is a main surface on which a transfer pattern is to be formed.

The edge face 1 constitutes the lateral surface of this plate-like body, and is adjacent to the outer edges of the opposing main surfaces 2. The edge face 1 has a flat edge face portion 1d and a curved edge face portion 1f. The flat edge face portion 1d is a surface that connects a side of one of the opposing main surfaces 2 and a side of the other opposing main surface 2, and comprises a lateral surface portion 1a and a chamfered surface portion 1b. The lateral surface portion 1a is a portion (T surface) that is nearly perpendicular to the opposing main surfaces 2 in the flat edge face portion 1d. The chamfered surface portion 1b is a portion (C surface) that is chamfered between the lateral surface portion 1a and the opposing main surfaces 2, and is formed between the lateral surface portion 1a and the opposing main surfaces 2

The curved edge face portion 1f is a portion (R portion) that is adjacent to the vicinity of a corner portion 10a of the substrate 10 when the substrate 10 is viewed from overhead, and comprises a lateral surface portion 1c and a chamfered surface portion 1e. Here, viewing the substrate 10 from overhead means that the substrate 10 is visible from, for example, a direction perpendicular to the opposing main surfaces 2. In addition, the corner portion 10a of the substrate 10 refers to, for example, the vicinity of the intersection of two sides along the outer edge of the opposing main surfaces 2. An intersection of two sides refers to the intersection of lines respectively extending from two sides. In the present example, the curved end face portion 1f is formed into a curved shape by rounding the corner portion 10a of the substrate 10.

In order to achieve the aforementioned object, the main surface of the mask blank substrate 10 of the present embodiment where a transfer pattern is formed has a root mean square roughness (RMS) of not more than 0.15 nm, and a power spectrum density at a spatial frequency of not less than 1 μm$^{-1}$ of not more than 10 nm$^4$, as obtained by measuring a 1 μm×1 μm region with an atomic force microscope using the aforementioned surface roughness (RMS) and power spectrum density.

In the present invention, the aforementioned 1 μm×1 μm region may be any arbitrary location in a transfer pattern formation region. When the size of the substrate 10 is that of a 6025 plate (152 mm×152 mm×6.35 mm), the transfer pattern formation region can be, for example, a region measuring 142 mm×142 mm, a region measuring 132 mm×132 mm or a region measuring 132 mm×104 mm obtained by excluding the peripheral region of the main surface of the substrate 10, and the aforementioned arbitrary location can be, for example, a region located in the center of the main surface of the substrate 10.

In addition, when carrying out a defect inspection on a main surface of the aforementioned mask blank substrate 10 using a highly sensitive defect inspection apparatus using a UV laser having a wavelength of 266 nm or an ArF excimer laser having a wavelength of 193 nm for the wavelength of the inspection light source, the power spectrum density at a spatial frequency of 1 μm$^{-1}$ to 10 μm$^{-1}$ obtained by measuring a 3 μm×3 μm region of the aforementioned main surface with an atomic force microscope is preferably not more than 30 nm$^4$, the power spectrum density at a spatial frequency of 1 μm$^{-1}$ to 10 μm$^{-1}$ is more preferably 1 nm$^4$ to 25 nm$^4$, and the power spectrum density at a spatial frequency of 1 μm$^{-1}$ to 10 μm$^{-1}$ is even more preferably 1 nm$^4$ to 20 nm$^4$.

Moreover, the integrated value I of power spectrum density (PSD) at a spatial frequency of 1 μm$^{-1}$ to 10 μm$^{-1}$ obtained by measuring a 3 μm×3 μm region on a main surface of the mask blank substrate 10 with an atomic force microscope is preferably not more than 100×10$^{-3}$ nm$^3$, more preferably not more than 90×10$^{-3}$ nm$^3$, even more preferably not more than 80×10$^{-3}$ nm$^3$, and still more preferably not more than 70×10$^{-3}$ nm$^3$.

In addition, the aforementioned root mean square roughness (RMS) is preferably not more than 0.12 nm, more preferably not more than 0.10 nm, even more preferably not more than 0.08 nm and still more preferably not more than 0.06 nm. In addition, the maximum height of surface roughness (Rmax) is preferably not more than 1.2 nm, more preferably not more than 1.0 nm, even more preferably not more than 0.8 nm, and still more preferably not more than 0.6 nm. It is preferable to manage both the parameters of root mean square roughness (RMS) and maximum height (Rmax) of the multilayer reflective film 21, the protective film 22 and the absorber film 24 formed on the mask blank substrate 10 from the viewpoint of improving reflectance and other optical properties. For example, the surface roughness of the surface of the mask blank substrate 10 is preferably such that the root mean square roughness (RMS) is not more than 0.12 nm and the maximum height (Rmax) is not more than 1.2 nm, more preferably such that the root mean square roughness (RMS) is not more than 0.10 nm and the maximum height (Rmax) is not more than 1.0 nm, even more preferably such that the root mean square roughness (RMS) is not more than 0.08 nm and the maximum height (Rmax) is not more than 0.8 nm, and still more preferably such that the root mean square roughness (RMS) is not more than 0.06 nm and the maximum height (Rmax) is not more than 0.6 nm.

A main surface of the mask blank substrate 10 is preferably processed by catalyst-referred etching. Catalyst-referred etching (to also be referred to as CARE) refers to a surface processing method involving arranging a processing target (mask blank substrate) and catalyst in a treatment liquid or supplying a treatment liquid between the processing target and the catalyst, allowing the processing target and catalyst to make contact, and processing the processing target with an active species generated from molecules in the treatment liquid that have been adsorbed onto the catalyst at that time. Furthermore, in the case the processing target is composed of a solid oxide such as glass, water is used for the treatment liquid, the processing target and the catalyst are allowed to make contact in the presence of the water, and the catalyst and surface of the processing target are allowed to undergo relative motion and the like to remove decomposition products of hydrolysis from the surface of the processing target.

Figure 9:
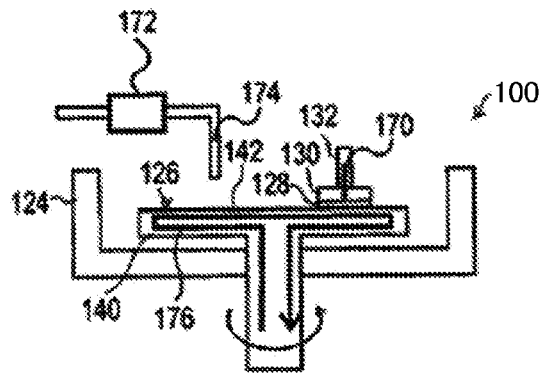
FIG. 9 is a schematic diagram of a catalyst-referred etching (CARE) apparatus used in an example.

A typical CARE processing apparatus is shown in FIG. 9. This CARE processing apparatus 100 has a treatment tank 124, a catalyst surface plate 126 rotatably arranged in the treatment tank 124, and a substrate holder 130 that removably holds a glass substrate (processing target) 128 with the surface (processed surface) facing downward. The substrate holder 130 is coupled to the end of a vertically movable rotating shaft 132 provided at a position in parallel with and offset from the center of the axis of rotation of the catalyst surface plate 126. The catalyst surface plate 126 consists of platinum 142, for example, having a prescribed thickness for use as a solid catalyst formed on the surface of a base 140 made of a rigid material composed of stainless steel, for example. Furthermore, although a bulk material may be used for the solid catalyst, it may also employ a configuration in which the platinum 142 is formed on an elastic base material such as fluorine-based rubber that is inexpensive and has favorable shape stability. In addition, within the substrate holder 130, a temperature control mechanism in the form of a heater 170 is embedded extending into the rotating shaft 132 in order to control the temperature of the glass substrate 128 held with the holder 130. A treatment liquid supply nozzle 174 is arranged above the treatment tank 124 that supplies treatment liquid (water), controlled to a prescribed temperature by a temperature control mechanism in the form of heat exchanger 172, to the treatment tank 124. Moreover, a temperature control mechanism in the form of a fluid flow path 176 is provided within the catalyst surface plate 126 that controls the temperature of the catalyst surface plate 126.

Etching by CARE using this CARE processing apparatus 100 is carried out in the manner indicated below. Treatment liquid is supplied from the treatment liquid supply nozzle 174 towards the catalyst surface plate 126. The processing target 128 held with the substrate holder 130 is then pressed onto the surface of the platinum (catalyst) 142 of the catalyst surface plate 126 at a prescribed pressure, and the catalyst surface plate 126 and the processing target 128 are rotated while introducing treatment liquid into the area where the processing target 128 and the platinum (catalyst) 142 of the catalyst surface plate 126 make contact (contact portion) to remove and flatten the surface (lower surface) of the processing target 128. Furthermore, the surface of the processing target 128 may also be removed and flattened (etched) by bringing the processing target 128 into extremely close proximity to the platinum (catalyst) 142 without pressing the processing target 128 held with the substrate holder 30 onto the platinum (catalyst) 142 of the catalyst surface plate 126 at a prescribed pressure.

Because the main surfaces of the mask blank substrate 10 are selectively processed by catalyst-referred etching starting from protrusions that contact a reference surface in the form of a catalyst surface, surface irregularities (surface roughness) that compose the main surfaces retain an extremely high level of smoothness while having an extremely uniform surface morphology, thereby resulting in a surface morphology in which the proportion of concave portions is greater than the proportion of convex portions with respect to the reference surface. Thus, when laminating a plurality of thin films on the aforementioned main surfaces, the size of defects on the main surfaces tends to become small, thereby making this preferable in terms of improving defect quality. This effect is especially demonstrated when forming the multilayer reflective film 21 to be subsequently described on an aforementioned main surface in particular. In addition, as a result of treating a main surface by catalyst-referred etching as previously described, a surface having the required surface roughness and power spectrum density can be formed comparatively easily.

Furthermore, in the case the material of the substrate 10 is a glass material, at least one type of material selected from the group consisting of platinum, gold, transition metals and alloys comprising at least one of these materials can be used for the catalyst. In addition, at least one type of treatment liquid selected from the group consisting of pure water, functional water such as ozonated water or hydrogen water, low-concentration aqueous alkaline solutions and low-concentration aqueous acidic solutions can be used for the treatment liquid.

A main surface on the side of the mask blank substrate 10 of the present embodiment on which a transfer pattern is formed is preferably processed so as to have high flatness at least from the viewpoints of obtaining pattern transfer accuracy and positional accuracy. In the case of an EUV reflective mask blank substrate 10, flatness in a region measuring 132 mm×132 mm or a region measuring 142 mm×142 mm on a main surface of the substrate 10 on the side on which a transfer pattern is formed is preferably not more than 0.1 µm and particularly preferably not more than 0.05 µm. In addition, flatness in a region measuring 132 mm×132 mm on a main surface of the substrate 10 on which a transfer pattern is formed is more preferably not more than 0.03 µm. In addition, the main surface on the opposite side from the side on which a transfer pattern is formed is the side that is clamped with an electrostatic chuck when the substrate is placed in an exposure apparatus, and flatness in a region measuring 142 mm×142 mm is preferably not more than 1 µm and particularly preferably not more than 0.5 µm.

Any material may be used for the material of the reflective mask blank substrate 10 for EUV exposure provided it has low thermal expansion properties. For example, a $SiO_2$—$TiO_2$-based glass having low thermal expansion properties (such as a two-element system ($SiO_2$—$TiO_2$) or three-element system (such as $SiO_2$—$TiO_2$—$SnO_2$)), or a so-called multicomponent glass such as $SiO_2$—$Al_2O_3$—$Li_2O$-based crystallized glass, can be used. In addition, a substrate other than the aforementioned glass made of silicon or metal and the like can also be used. An example of the aforementioned metal substrate is an invar alloy (Fe—Ni-based alloy).

As was previously described, in the case of the mask blank substrate 10 for EUV exposure, although a multicomponent glass material is used since the substrate is required to have low thermal expansion properties, there is the problem of it being difficult to obtain high smoothness in comparison with synthetic quartz glass. In order to solve this problem, a thin film composed of a metal or an alloy, or a thin film composed of a material containing at least one of oxygen, nitrogen and carbon in a metal or alloy, is formed on a substrate composed of a multicomponent glass material. A surface having a surface roughness and a power spectrum density within the specified ranges can then be formed comparatively easily by subjecting the surface of this thin film to mirror polishing and surface treatment.

Preferable examples of the material of the aforementioned thin film include Ta (tantalum), alloys containing Ta, and Ta compounds containing at least one of oxygen, nitrogen and carbon therein. Examples of Ta compounds that can be used include those selected from TaB, TaN, TaO, TaON, TaCON, TaBN, TaBO, TaBON, TaBCON, TaHf, TaHfO, TaHfN, TaHfON, TaHfCON, TaSi, TaSiO, TaSiN, TaSiON and TaSiCON. Among these Ta compounds, those selected from TaN, TaON, TaCON, TaBN, TaBON, TaBCON, TaHfN, TaHfON, TaHfCON, TaSiN, TaSiON and TaSiCON that contain nitrogen (N) are used more preferably. Furthermore, from the viewpoint of high smoothness of the thin film surface, the aforementioned thin film preferably has a microcrystalline structure or amorphous structure. The crystal structure of the thin film can be measured with an X-ray diffraction (XRD) analyzer.

Furthermore, in the present invention, there are no particular limitations on the processing method used to obtain the previously defined surface roughness and power spectrum density. The present invention is characterized by managing the surface roughness and power spectrum density of the mask blank substrate 10, and can be realized by, for example, processing methods like those exemplified in the examples to be subsequently described.

[Substrate with Multilayer Reflective Film 20]

The following provides an explanation of the substrate with a multilayer reflective film 20 according to one embodiment of the present invention.

FIG. 2 is a schematic diagram showing the substrate with a multilayer reflective film 20 of the present embodiment.

The substrate with a multilayer reflective film 20 of the present embodiment has a structure having the multilayer reflective film 21 on or above a main surface of the previously explained mask blank substrate 10 on the side on which a transfer pattern is formed. This multilayer reflective film 21 imparts a function of reflecting EUV light in a reflective mask 40 for EUV lithography, and adopts a configuration in which elements having different refractive indices are cyclically laminated.

Although there are no particular limitations on the material of the multilayer reflective film 21 provided it reflects EUV light, the reflectance of the multilayer reflective film 21 alone is normally not less than 65% and the upper limit thereof is normally 73%. This type of multilayer reflective film 21 can be that of a multilayer reflective film 21 in which a thin film composed of a high refractive index material (high refractive index layer) and a thin film composed of a low refractive index material (low refractive index layer) are alternately laminated for about 40 to 60 cycles.

For example, the multilayer reflective film 21 for EUV light of a wavelength of 13 nm to 14 nm preferably consists of an Mo/Si cyclically laminated film obtained by alternately laminating about 40 cycles of an Mo film and Si film. In addition, a multilayer reflective film 21 used in the region of EUV light can consist of, for example, an Ru/Si cyclically laminated film, Mo/Be cyclically laminated film, Mo compound/Si compound cyclically laminated film, Si/Nb cyclically laminated film, Si/Mo/Ru cyclically laminated film, Si/Mo/Ru/Mo cyclically laminated film or Si/Ru/Mo/Ru cyclically laminated film.

Although the method used to form the multilayer reflective film 21 is known in the art, the multilayer reflective film 21 can be formed by depositing each layer by, for example, magnetron sputtering or ion beam sputtering. In the case of the aforementioned Mo/Si cyclically laminated film, an Si film having a thickness of about several nm is first deposited on the substrate 10 using an Si target by, for example, ion beam sputtering, followed by depositing an Mo film having a thickness of about several nm using an Mo target, with this deposition comprising one cycle, and laminating for 40 to 60 cycles to form the multilayer reflective film 21.

The protective film 22 (see FIG. 3) can be formed to protect the multilayer reflective film 21 from dry etching or wet cleaning in the manufacturing process of the reflective mask 40 for EUV lithography. In this manner, an aspect having the multilayer reflective film 21 and the protective film 22 on the mask blank substrate 10 can also constitute the substrate with a multilayer reflective film 20 in the present invention.

Furthermore, although materials such as Ru, Ru—(Nb, Zr, Y, B, Ti, La, Mo), Si—(Ru, Rh, Cr, B), Si, Zr, Nb, La or B can be used for the material of the aforementioned protective film 22, among these materials, reflectance properties of the multilayer reflective film 21 can be made more favorable if a material comprising ruthenium (Ru) is applied. More specifically, the material of the protective film 22 is preferably Ru or Ru—(Nb, Zr, Y, B, Ti, La, Mo). This type of protective film 22 is particularly effective when using a Ta-based material for the absorber film 24 and patterning the absorber film 24 by dry etching with a Cl-based gas.

The surface of the aforementioned multilayer reflective film 21 or the aforementioned protective film 22 in the substrate with a multilayer reflective film 20 of the present invention has an integrated value I of power spectrum density (PSD) at a spatial frequency of 1 $\mu m^{-1}$ to 10 $\mu m^{-1}$, obtained by measuring a 3 μm×3 μm region with an atomic force microscope, of not more than $180 \times 10^{-3}$ $nm^3$, preferably not more than $170 \times 10^{-3}$ $nm^3$, more preferably not more than $160 \times 10^{-3}$ $nm^3$ and even more preferably not more than $150 \times 10^{-3}$ $nm^3$. Moreover, the surface of the aforementioned multilayer reflective film 21 or the aforementioned protective film 22 in the aforementioned substrate with a multilayer reflective film 20 has a maximum value of power spectrum density (PSD) at a spatial frequency of 1 $\mu m^{-1}$ to 10 $\mu m^{-1}$, obtained by measuring a 3 μm×3 μm region with an atomic force microscope, of not more than 50 $nm^4$, preferably not more than 45 $nm^4$ and more preferably not more than 40 $nm^4$. As a result of employing such a configuration, the detection of pseudo defects in a defect inspection of the surface of the multilayer reflective film 21 or the protective film 22 using a highly sensitive defect inspection apparatus can be inhibited and critical defects can be made more conspicuous. In addition, as a result of employing such a configuration, when carrying out a defect inspection of the substrate with a multilayer reflective film 20 with a highly sensitive defect inspection apparatus using inspection light of the wavelength region of 150 nm to 365 nm, such as the previously exemplified highly sensitive defect inspection apparatus using a UV laser having a wavelength of 266 nm or an ArF excimer laser having a wavelength of 193 nm for the wavelength of the inspection light source, detection of pseudo defects can be significantly inhibited.

In the present invention, the region of a prescribed size measured with an atomic force microscope in order to analyze power spectrum (the aforementioned 3 μm×3 μm region) may be any arbitrary transfer pattern formation region. In the case the size of the substrate 10 is that of a 6025 plate (152 mm×152 mm×6.35 mm), the transfer pattern formation region can be, for example, a region measuring 142 mm×142 mm, a region measuring 132 mm×132 mm or a region measuring 132 mm×104 mm obtained by excluding the peripheral region of a main surface of the substrate 10, and the aforementioned arbitrary location can be a region located in the center of a main surface of the substrate 10, for example.

In the substrate with a multilayer reflective film 20 of the present invention, the power spectrum density at a spatial frequency of 1 μm$^{-1}$ to 10 μm$^{-1}$, obtained by measuring a 3 μm×3 μm region with an atomic force microscope, has the characteristic of an overall monotonic decrease.

Figure 7:
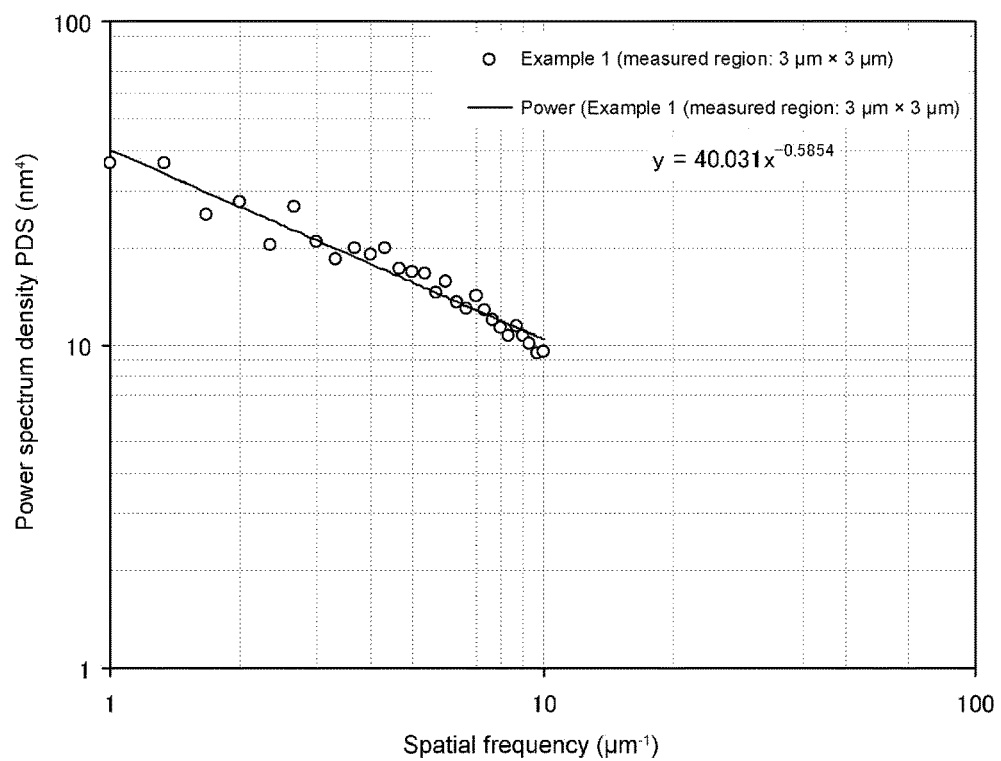
FIG. 7 indicates the results of subjecting the data shown in FIG. 6 to power approximation over a spatial frequency of 1 μm$^{-1}$ to 10 μm$^{-1}$.

As shown in FIG. 7, for example, an overall monotonic decrease refers to a gradual decrease in power spectrum density such that an approximation curve approaches a high spatial frequency of 10 μm$^{-1}$ from a low spatial frequency of 1 μm$^{-1}$ when the relationship between spatial frequency and power spectrum density is approximated by a prescribed approximation curve. In the example shown in FIG. 7, a power approximation is used for the approximation curve. In general, data can be approximated by the following power curve equation using power approximation when x is defined as the spatial frequency and y is defined as power spectrum density (PSD).

$$y = a \cdot x^b \text{ (wherein, } a \text{ and } b \text{ are constants)}$$

In the case of power approximation, in the case the exponent value b of x in the power curve equation is negative, the power spectrum density can be said to have the characteristic of an overall monotonic decrease. As a result of power spectrum density within a prescribed spatial frequency range having the characteristic of an overall monotonic decrease, detection of pseudo defects in a defect inspection using a highly sensitive defect inspection apparatus can be further inhibited while making critical defects even more conspicuous.

In the substrate with a multilayer reflective film 20 of the present invention, the integrated value I of the power spectrum density (PSD) at a spatial frequency of 1 μm$^{-1}$ to 5 μm$^{-1}$ of the surface of the aforementioned multilayer reflective film 21 or the aforementioned protective film 22, obtained by measuring a 3 μm×3 μm region with an atomic force microscope, is preferably not more than 115×10$^{-3}$ nm$^3$, more preferably not more than 105×10$^{-3}$ nm$^3$ and even more preferably not more than 95×10$^{-3}$ nm$^3$. As a result of employing such a configuration, when carrying out a defect inspection of the substrate with a multilayer reflective film 20 with a highly sensitive defect inspection apparatus using inspection light of the wavelength region of 150 nm to 365 nm, such as the previously exemplified highly sensitive defect inspection apparatus using a UV laser having a wavelength of 266 nm or an ArF excimer laser having a wavelength of 193 nm for the wavelength of the inspection light source, detection of pseudo defects can be significantly inhibited.

In addition, in the substrate with a multilayer reflective film 20 of the present invention, the integrated value I of the power spectrum density (PSD) at a spatial frequency of 10 μm$^{-1}$ to 100 μm$^{-1}$ of the surface of the aforementioned multilayer reflective film 21 or the aforementioned protective film 22, obtained by measuring a 1 μm×1 μm region with an atomic force microscope, is not more than 150×10$^{-3}$ nm$^3$, preferably not more than 140×10$^{-3}$ nm$^3$, more preferably not more than 135×10$^{-3}$ nm$^3$ and even more preferably not more than 130×10$^{-3}$ nm$^3$. Moreover, in the aforementioned substrate with a multilayer reflective film 20, the maximum value of the power spectrum density (PSD) at a spatial frequency of 10 μm$^{-1}$ to 100 μm$^{-1}$ of the surface of the aforementioned multilayer reflective film 21 or the aforementioned protective film 22 is not more than 9 nm$^4$, preferably not more than 8 nm$^4$, more preferably not more than 7 nm$^4$, and even more preferably not more than 6 nm$^4$. As a result of employing such a configuration, when carrying out a defect inspection of the substrate with a multilayer reflective film 20 with a highly sensitive defect inspection apparatus using inspection light of the wavelength region of 0.2 nm to 100 nm, such as a highly sensitive defect inspection apparatus using EUV light having a wavelength of 13.5 nm for the wavelength of the inspection light source, detection of pseudo defects can be significantly inhibited.

In the substrate with a multilayer reflective film 20 of the present invention, power spectrum density at a spatial frequency of 10 μm$^{-1}$ to 100 μm$^{-1}$, obtained by measuring a 1 μm×1 μm region with an atomic force microscope, preferably has the characteristic of an overall monotonic decrease. An overall monotonic decrease refers to that previously explained with reference to FIG. 7 with the exception of making the spatial frequency range to be 10 μm$^{-1}$ to 100 μm$^{-1}$. As a result of power spectrum density within a prescribed spatial frequency range having the characteristic of an overall monotonic decrease, detection of pseudo defects in a defect inspection using a highly sensitive defect inspection apparatus can be further inhibited and critical defects can be made to be even more conspicuous.

The substrate with a multilayer reflective film 20 of the present invention preferably has the protective film 22 on or above the multilayer reflective film 21. Because damage to the surface of the multilayer reflective film 21 can be inhibited when fabricating a transfer mask (EUV mask) as a result of the substrate with a multilayer reflective film 20 having the protective film 22 on the multilayer reflective film 21, reflectance properties with respect to EUV light can be further improved. In addition, in the substrate with a multilayer reflective film 20, detection of pseudo defects in a defect inspection of the surface of the protective film 22 using a highly sensitive defect inspection apparatus can be inhibited and critical defects can be made to be more conspicuous. When the substrate with a multilayer reflective film 20 has the protective film 22, the prescribed integrated value I of power spectrum density (PSD) and the prescribed maximum value of power spectrum density (PSD) as previously described can be obtained based on a spatial frequency obtained by measuring the surface of the protective film 22 with an atomic force microscope.

Moreover, in addition to the effect of enabling the detection of pseudo defects to be inhibited significantly in a defect inspection using a highly sensitive defect inspection apparatus as previously described, in order to improve reflection properties required for use as the substrate with a multilayer reflective film 20, the root mean square roughness (RMS) of the aforementioned substrate with a multilayer reflective film 20 on the surface of the multilayer reflective film 21 or the protective film 22, obtained by measuring a 1 μm×1 μm region with an atomic force microscope, is preferably not more than 0.15 nm. The root mean square roughness (RMS) is more preferably not more than 0.13 nm and even more preferably not more than 0.12 nm.

A sputtering method for maintaining the surface morphology of the aforementioned substrate 10 and allowing the surface of the multilayer reflective film 21 or the protective film 22 to have a power spectrum density within the aforementioned range is as described below. Namely, a surface having a power spectrum density within the aforementioned range can be obtained by depositing the multilayer reflective film 21 by sputtering so that a high refractive index layer and a low refractive index layer accumulate on an angle to the normal of a main surface of the substrate 10. More specifically, the multilayer reflective film 21 is deposited by making the incident angle of sputtered particles for depositing a low refractive index layer consisting of Mo and the like and the incident angle of sputtered particles for depositing a high refractive index layer consisting of Si and the like to be greater than 0 degrees to not more than 45 degrees, more preferably greater than 0 degrees to not more than 40 degrees, and even more preferably greater than 0 degrees to not more than 30 degrees. Moreover, the protective layer 22 formed on the multilayer reflective film 21 is also preferably formed by ion beam sputtering in continuation therefrom so that the protective layer 22 accumulates on an angle to the normal of a main surface of the substrate 10.

In addition, in the substrate with a multilayer reflective film 20, a back side electrically conductive film 23 (see FIG. 3) can also be formed on the surface of the substrate 10 on the opposite side from the surface contacting the multilayer reflective film 21 for the purpose of electrostatic clamping. In this manner, an aspect having the multilayer reflective film 21 and the protective film 22 on the side of the mask blank substrate 10 on which a transfer pattern is formed, and having the back side electrically conductive film 23 on the surface on the opposite side from the surface contacting the multilayer reflective film 21, also constitutes the substrate with a multilayer reflective film 20 in the present invention. Furthermore, the electrical property (sheet resistance) required by the back side electrically conductive film 23 is normally not more than 100Ω/square. The method used to form the back side electrically conductive film 23 is a known method. The back side electrically conductive film 23 can be formed, for example, using a metal or alloy target of Cr or Ta and the like by magnetron sputtering or ion beam sputtering.

In addition, the substrate with a multilayer reflective film 20 of the present embodiment may also have a base layer formed between the substrate 10 and the multilayer reflective film 21. The base layer can be formed for the purpose of improving smoothness of a main surface of the substrate 10, reducing defects, demonstrating the effect of enhancing reflectance of the multilayer reflective film 21, and compensating for stress in the multilayer reflective film 21.

[Reflective Mask Blank]

The following provides an explanation of the reflective mask blank 30 according to one embodiment of the present invention.

Figure 3:
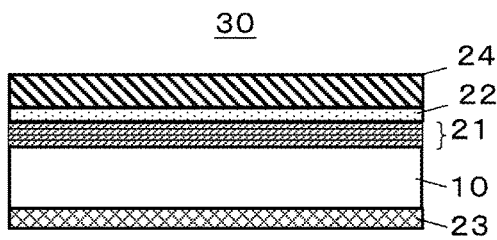
FIG. 3 is a cross-sectional schematic diagram showing one example of the configuration of a reflective mask blank according to one embodiment of the present invention.

FIG. 3 is a schematic diagram showing the reflective mask blank 30 of the present embodiment.

The reflective mask blank 30 of the present embodiment employs a configuration in which an absorber film 24 serving as a transfer pattern is formed on the protective film 22 of the previously explained substrate with a multilayer reflective film 20.

The aforementioned absorber film 24 is only required to be that which functions to absorb exposure light in the form of EUV light, and has a desired difference in reflectance between light reflected by the aforementioned multilayer reflective film 21 and/or the protective film 22 and light reflected by an absorber pattern 27 in a reflective mask 40 fabricated using the reflective mask blank 30.

For example, reflectance with respect to EUV light of the absorber film 24 is set to between 0.1% and 40%. Moreover, in addition to the aforementioned difference in reflectance, the absorber film 24 may also have a desired phase difference between light reflected by the aforementioned multilayer reflective film 21 and/or the protective film 22 and light reflected by the absorber pattern 27. Furthermore, in the case of having such a desired phase difference between reflected light, the absorber film 24 in the reflective mask blank 30 may be referred to as a phase shift film. When the contrast of reflected light of the reflective mask 40 is improved by providing the aforementioned desired phase difference between reflected light, the phase difference is preferably set to within the range of 80 degrees±10 degrees, the absolute reflectance of the absorber film 24 is preferably set to 1.5% to 30%, and the reflectance of the absorber film 24 with respect to the surface of the multilayer reflective film 21 and/or the protective film 22 is preferably set to 2% to 40%.

The aforementioned absorber film 24 may be a single layer or a multilayered structure. In the case of a multilayered structure, the laminated films may be of the same material or different materials. The laminated film can be that in which the materials and/or composition change incrementally or continuously in the direction of film thickness.

There are no particular limitations on the material of the aforementioned absorber film 24. For example, a material having the function of absorbing EUV light that is composed of Ta (tantalum) alone or a material having Ta as the main component thereof is used preferably. A material having Ta as the main component thereof is normally a Ta alloy. The crystalline state of this absorber film 24 is such that it preferably has an amorphous or microcrystalline structure from the viewpoints of smoothness and flatness. Examples of materials having Ta as the main component thereof include materials containing Ta and B, materials containing Ta and N, materials containing Ta and B and further containing at least O or N, materials containing Ta and Si, materials containing Ta, Si and N, materials containing Ta and Ge, and materials containing Ta, Ge and N. In addition, an amorphous structure is easily obtained by adding, for example, B, Si or Ge and the like to Ta, thereby making it possible to improve smoothness. Moreover, if N and/or O are added to Ta, resistance to oxidation improves, thereby making it possible to improve stability over time. In order to maintain the surface morphology of the substrate 10 and the substrate with a multilayer reflective film 20 within the aforementioned ranges and allow the surface of the absorber film 24 to have a power spectrum density within the aforementioned ranges, a microcrystalline structure or amorphous structure is preferably employed for the absorber film 24. Crystal structure can be confirmed with an X-ray diffraction (XRD) analyzer.

In the reflective mask blank 30 of the present invention, the film thickness of the absorber film 24 is set to the film thickness required for the absorber film 24 to have the desired difference in reflectance between light reflected by the multilayer reflective film 21 and the protective film 22 and light reflected by the absorber pattern 27. The film thickness of the absorber film 24 is preferably not more than 60 nm in order to reduce shadowing effects.

In addition, in the reflective mask blank 30 of the present invention, the aforementioned absorber film 24 can be given a phase shift function having a desired phase shift difference between light reflected by the aforementioned multilayer reflective film 21 and/or the protective film 22 and light reflected by the absorber pattern 27. In that case, the resulting reflective mask blank 30 serves as the master of the reflective mask 40 having improved transfer resolution by EUV light. In addition, because the film thickness of the absorber film 24 required to demonstrate a phase shift effect needed to demonstrate desired transfer resolution can be reduced in comparison with that in the prior art, a reflective mask blank is obtained in which shadowing effects are reduced.

There are no particular limitations on the material of the absorber film 24 having a phase shift function. For example, Ta alone or a material having Ta as the main component thereof can be used as previously described, or another material may be used. Examples of materials other than Ta include Ti, Cr, Nb, Mo, Ru, Rh and W. In addition, an alloy containing two or more elements among Ta, Ti, Cr, Nb, Mo, Ru, Rh and W can be used for the material, and/or a multilayer film consisting of these elements can be used. In addition, one or more elements selected from nitrogen, oxygen and carbon may also be contained in these materials. Among these, by employing a material containing nitrogen, the root mean square roughness (RMS) and amplitude intensity in the form of the power spectrum density of all roughness components at a spatial frequency of 1 $\mu m^{-1}$ to 10 $\mu m^{-1}$ detected in a region measuring 3 $\mu m \times 3$ $\mu m$ of the surface of the absorber film can be reduced, and the reflective mask blank 30 can be obtained that is able to inhibit the detection of pseudo defects in a defect inspection using a highly sensitive defect inspection apparatus, thereby making this preferable. Furthermore, in the case of using the absorber film 24 in the form of a laminated film, the laminated film may be a laminated film consisting of layers of the same material or a laminated film consisting of layers of different materials. In the case of using a laminated film consisting of layers of different materials for the absorber film 24, the materials that compose this plurality of layers may be materials having mutually different etching properties to obtain the absorber film 24 having an etching mask function.

The surface of the aforementioned absorber film 24 preferably has a power spectrum density at a spatial frequency of 1 $\mu m^{-1}$ to 10 $\mu m^{-1}$, obtained by a measuring a region measuring 3 $\mu m \times 3$ $\mu m$ with an atomic force microscope, of not more than 50 $nm^4$, and more preferably has a power spectrum density at a spatial frequency of 1 $\mu m^{-1}$ to 10 $\mu m^{-1}$, obtained by measuring a region measuring 3 $\mu m \times 3$ $\mu m$ with an atomic force microscope, of not more than 40 $nm^4$. As a result of employing such a configuration, when carrying out a defect inspection on the reflective mask blank 30 with a multilayer reflective film 20 with a highly sensitive defect inspection apparatus that uses inspection light in the wavelength region of 150 nm to 365 nm, such as the previously mentioned highly sensitive inspection apparatus using a UV laser having an inspection light source wavelength of 266 nm or ArF excimer laser having an inspection light source wavelength of 193 nm, detection of pseudo defects can be inhibited significantly.

Moreover, in addition to the surface of the aforementioned absorber film 24 having a power spectrum density at a spatial frequency of 1 $\mu m^{-1}$ to 10 $\mu m^{-1}$, obtained by a measuring a region measuring 3 $\mu m \times 3$ $\mu m$ with an atomic force microscope, of not more than 50 $nm^4$, the integrated value I of power spectrum density (PSD) at a spatial frequency of 1 $\mu m^{-1}$ to 10 $\mu m^{-1}$ is preferably not more than $800 \times 10^{-3}$ $nm^3$. As a result of employing such a configuration, detection of pseudo defects under a plurality of levels of inspection sensitivity conditions using a highly sensitive defect inspection apparatus that uses inspection light in the wavelength region of 150 nm to 365 nm, such as the previously mentioned highly sensitive inspection apparatus using a UV laser having an inspection light source wavelength of 266 nm or ArF excimer laser having an inspection light source wavelength of 193 nm, can be inhibited while making critical defects more conspicuous. The aforementioned integrated value I is preferably not more than $650 \times 10^{-3}$ $nm^3$, more preferably not more than $500 \times 10^{-3}$ $nm^3$ and particularly preferably not more than $450 \times 10^{-1}$ $nm^3$. The aforementioned integrated value I of the absorber film 24 can be adjusted according to such factors as the material, composition, film thickness and deposition conditions of the absorber film.

Furthermore, the reflective mask blank 30 of the present invention is not limited to the configuration shown in FIG. 3. For example, a resist film serving as a mask for patterning the aforementioned absorber film 24 can also be formed on the absorber film 24, and this reflective mask blank 30 having a resist film can also constitute the reflective mask blank 30 of the present invention. Furthermore, the resist film formed on the absorber film 24 may be a positive resist or negative resist. In addition, the resist film may be for electron beam drawing or laser drawing. Moreover, a so-called hard mask (etching mask) film can also be formed between the absorber film 24 and the aforementioned resist film, and this aspect can also constitute the reflective mask blank 30 of the present invention.

A hard mask film 25 may be stripped after having formed a transfer pattern on the absorber film 24 or the absorber film 24 may employ a laminated structure consisting of a plurality of layers in the reflective mask blank 30 in which a hard mask film is not formed, and the materials that compose this plurality of layers may have mutually different etching properties to obtain a reflective mask blank 30 having the absorber film 24 that demonstrates an etching mask function.

[Reflective Mask]

The following provides an explanation of the reflective mask 40 according to one embodiment of the present invention.

Figure 4:
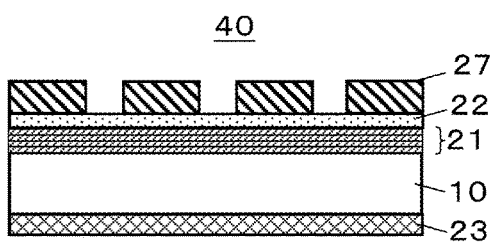
FIG. 4 is a cross-sectional schematic diagram showing one example of a reflective mask according to one embodiment of the present invention.

FIG. 4 is a schematic diagram showing the reflective mask 40 of the present embodiment.

The reflective mask 40 of the present embodiment employs a configuration in which the absorber pattern 27 is formed on the aforementioned protective film 22 by patterning the absorber film 24 on the aforementioned reflective mask blank 30. As a result of exposure light such as EUV light being absorbed at the portion of the mask surface where the absorber film 24 is present when the reflective mask 40 of the present embodiment is exposed with exposure light, and exposure light being reflected by the exposed protective layer 22 and the multilayer reflective film 21 at other portions where the absorber film 24 has been removed, the reflective mask 40 can be used for lithography.

[Method of Manufacturing Semiconductor Device]

A semiconductor device, having various patterns formed on a semiconductor substrate, can be manufactured by transferring a transfer pattern, such as a circuit pattern, based on the absorber pattern 27 of the reflective mask 40, to a resist film formed on a transferred substrate such as a semiconductor substrate by using the previously explained reflective mask 40 and a lithography process using an exposure apparatus, followed by going through various other steps.

Furthermore, fiducial marks can be formed on the previously described mask blank substrate 10, the substrate with a multilayer reflective film 20 and the reflective mask blank 30, and the coordinates of the locations of these fiducial marks and the locations of critical defects detected with a highly sensitive defect inspection apparatus as previously described can be managed. When fabricating the reflective mask 40 based on the resulting critical defect location information (defect data), drawing data can be corrected and defects can be reduced so that the absorber pattern 27 is formed at those locations where critical defects are present based on the aforementioned defect data and transferred pattern (circuit pattern) data.

EXAMPLES

The following provides an explanation of examples of fabricating the substrate with a multilayer reflective film 20 for EUV exposure, the reflective mask blank 30 and the reflective mask 40 of the present invention as examples thereof.

First, the multilayer reflective film 21 was deposited on the surface of the mask blank substrate 10 for EUV exposure in the manner described below to fabricate the substrate with a multilayer reflective film 20 of Examples 1 and 2 and Comparative Example 1.

Fabrication of Mask Blank Substrates of Example 1 and Comparative Example 1

The mask blank substrate used in Example 1 and Comparative Example 1 was fabricated in the manner described below.

An $SiO_2$—$TiO_2$-based glass substrate having a size of 152 mm×152 mm and a thickness of 6.35 mm was prepared for use as the mask blank substrate 10, and the front and back surfaces of the glass substrate were sequentially polished with cerium oxide abrasive particles and colloidal silica abrasive particles using a double-sided polishing apparatus followed by treating the surfaces with a low concentration of hydrofluorosilicic acid. Measurement of the surface roughness of the resulting glass substrate surface with an atomic force microscope yielded a root mean square roughness (RMS) of 0.5 nm.

The surface morphology (surface form, flatness) and total thickness variation (TTV) of regions measuring 148 mm×148 mm on the front and back surfaces of the glass substrate were measured with a wavelength-shifting interferometer using a wavelength-modulating laser. As a result, the flatness of the front and back surfaces of the glass substrate was 290 nm (convex shape). The results of measuring the surface morphology (flatness) of the glass substrate surface were stored in a computer in the form of height information with respect to a reference surface for each measurement point, compared with a reference value of 50 nm (convex shape) for the flatness of the front surface and a reference value of 50 nm for the flatness of the back surface required by glass substrates, and the differences therewith (required removal amounts) were calculated by computer.

Next, processing conditions for local surface processing were set corresponding to the required removal amounts for each processing spot-shaped region on the surface of the glass substrate. A dummy substrate was used and preliminarily processed at a spot in the same manner as actual processing without moving the substrate for a fixed period of time, the morphology thereof was measured with the same measuring instrument as the apparatus used to measure the surface morphology of the aforementioned front and back surfaces, and the processing volume of the spot was measured per unit time. The scanning speed during Raster scanning of the glass substrate was then determined in accordance with the required removal amount obtained from the spot information and surface morphology information of the glass substrate.

Surface morphology was adjusted by carrying out local surface processing treatment in accordance with the set processing conditions by magnetorheological finishing (MRF) using a substrate finishing apparatus employing a magnetorheological fluid so that the flatness of the front and back surfaces of the glass substrate was not more than the aforementioned reference values. Furthermore, the magnetorheological fluid used at this time contained an iron component, and the polishing slurry used an alkaline aqueous solution containing about 2% by weight of an abrasive in the form of cerium oxide. Subsequently, the glass substrate was immersed in a cleaning tank containing an aqueous hydrochloric acid solution having a concentration of about 10% (temperature: about 25° C.) for about 10 minutes followed by rinsing with pure water and drying with isopropyl alcohol (IPA).

Measurement of the surface morphology (surface form, flatness) of the resulting glass substrate surface yielded flatness for the front and back surfaces of about 40 nm to 50 nm. In addition, when surface roughness of the glass substrate surface was measured using an atomic force microscope in a region measuring 1 μm×1 μm at an arbitrary location of the transfer pattern formation region (132 mm×132 mm), root mean square roughness (RMS) was 0.37 nm, indicating a rough state attributable to surface roughness prior to local surface processing by MRF.

Consequently, double-sided polishing was carried out on the front and back surfaces of the glass substrate using a double-sided polishing apparatus under polishing conditions that maintain or improve the surface morphology of the glass substrate surface. Finishing polishing was carried out under the polishing conditions indicated below.

Machining fluid: Aqueous alkaline solution (NaOH)+ abrasive (concentration: about 2% by weight)
Abrasive: Colloidal silica, mean particle diameter: about 70 nm Polishing surface plate rotating speed: About 1 rpm to 50 rpm
Processing pressure: About 0.1 kPa to 10 kPa
Processing time: About 1 minute to 10 minutes Subsequently, the glass substrate was cleaned with an aqueous alkaline solution (NaOH) to obtain the mask blank substrate 10 for EUV exposure.

When the flatness and surface roughness of the front and back surfaces of the resulting mask blank substrate 10 were measured, the flatness on the front and back surfaces was about 40 nm, indicating that the state prior to processing with the double-sided polishing apparatus was favorably maintained or improved. In addition, when a 1 μm×1 μm region at an arbitrary location of the transfer pattern formation region (132 mm×132 mm) of the resulting mask blank substrate 10 was measured with an atomic force microscope, root mean square roughness (RMS) was 0.145 nm and maximum height (Rmax) was 1.4 nm. In addition, the maximum value of power spectrum density (PSD) at a spatial frequency of 1 $\mu m^{-1}$ to 10 $\mu m^{-1}$ was 5.94 $nm^4$, and the integrated value I of power spectrum density (PSD) at a spatial frequency of 1 $\mu m^{-1}$ to 10 $\mu m^{-1}$ was $42.84 \times 10^{-3}$ $nm^3$. In addition, the maximum value of power spectrum density (PSD) at a spatial frequency of 10 $\mu m^{-1}$ to 100 $\mu m^{-1}$ was 3.49 $nm^4$, and the integrated value I of power spectrum density (PSD) at a spatial frequency of 10 $\mu m^{-1}$ to 100 $\mu m^{-1}$ was $106.96 \times 10^{-3}$ $nm^3$.

Moreover, when the resulting mask blank substrate 10 was measured with an atomic force microscope in a region measuring 3 μm×3 μm at an arbitrary location of the transfer pattern formation region (132 mm×132 mm), the maximum value of power spectrum density (PSD) at a spatial frequency of 1 μm$^{-1}$ to 10 μm$^{-1}$ was 20.41 nm$^4$, and the integrated value I of power spectrum density (PSD) at a spatial frequency of 1 μm$^{-1}$ to 10 μm$^{-1}$ was 93.72×10$^{-3}$ nm$^3$.

Furthermore, the local processing method used for the mask blank substrate 10 in the present invention is not limited to the aforementioned magnetorheological finishing. A processing method using gas cluster ion beams (GCIB) or localized plasma may also be used.

The mask blank substrates 10 used in Example 1 and Comparative Example 1 were fabricated in the manner described above.

Fabrication of Mask Blank Substrate of Example 2

The mask blank substrate 10 used in Example 2 was fabricated in the manner indicated below.

Surface processing by catalyst-referred etching (CARE) was carried out on the front and back surfaces of the glass substrate for the purpose of further decreasing the PSD of a high spatial frequency region (not less than 1 μm$^{-1}$) for the mask blank substrate 10 obtained according to the previously described fabrication method of Example 1. A schematic diagram of the CARE processing apparatus used is shown in FIG. 9. Furthermore, processing conditions were as indicated below.

Machining fluid: Pure water
Catalyst: Pt
Substrate rotating speed: 10.3 rpm
Catalyst surface plate rotating speed: 10 rpm
Processing time: 50 minutes
Processing pressure: 250 hPa Subsequently, after scrubbing the edge faces of the glass substrate, the glass substrate was immersed in a cleaning tank containing aqua regia (temperature: about 65° C.) for about 10 minutes followed by rinsing with pure water and drying. Furthermore, cleaning with aqua regia was carried out several times until there was no longer any Pt catalyst residue on the front and back surfaces of the glass substrate.

When a 1 μm×1 μm region at an arbitrary location of the transfer pattern formation region (132 mm×132 mm) of the resulting mask blank substrate 10 was measured with an atomic force microscope, the surface roughness thereof was such that root mean square roughness (RMS) was 0.081 nm and maximum height (Rmax) was 0.8 nm. In addition, the maximum value of power spectrum density (PSD) at a spatial frequency of 1 μm$^{-1}$ to 10 μm$^{-1}$ was 4.93 nm$^4$, and the integrated value I of power spectrum density (PSD) at a spatial frequency of 1 μm$^{-1}$ to 10 μm$^{-1}$ was 29.26×10$^{-3}$ nm$^3$. In addition, the maximum value of power spectrum density (PSD) at a spatial frequency of 10 μm$^{-1}$ to 100 μm$^{-1}$ was 1.91 nm$^4$, and the integrated value I of power spectrum density (PSD) at a spatial frequency of 10 μm$^{-1}$ to 100 μm$^{-1}$ was 68.99×10$^{-3}$ nm$^3$.

Moreover, when the resulting mask blank substrate 10 was measured with an atomic force microscope in a region measuring 3 μm×3 μm at an arbitrary location of the transfer pattern formation region (132 mm×132 mm), the maximum value of power spectrum density (PSD) at a spatial frequency of 1 μm$^{-1}$ to 10 μm$^{-1}$ was 23.03 nm$^4$, and the integrated value I of power spectrum density (PSD) at a spatial frequency of 1 μm$^{-1}$ to 10 μm$^{-1}$ was 61.81×10$^{-3}$ nm$^3$.

As indicated by these results, surface processing by CARE made it possible to reduce surface roughness in a high spatial frequency region. In addition, root mean square roughness (RMS) at a spatial frequency of 10 μm$^{-1}$ to 100 μm$^{-1}$ was favorable at 0.08 nm.

The mask blank substrate 10 used in Examples 2 and 3 was fabricated in the manner described above.

Fabrication of Multilayer Reflective Films of Examples 1 and 2

Deposition of the multilayer reflective film 21 of Examples 1 and 2 was carried out in the manner indicated below. Namely, a Mo layer (low refractive index layer, thickness: 2.8 nm) and a Si layer (high refractive index layer, thickness: 4.2 nm) were alternately laminated by ion beam sputtering (number of laminated pairs: 40) to form the multilayer reflective film 21 on the aforementioned glass substrate. During deposition of the multilayer reflective film 21 by ion beam sputtering, the incident angle of sputtered Mo and Si particles relative to the normal of a main surface of the glass substrate in ion beam sputtering was 30 degrees and ion source gas flow rate was 8 sccm.

After depositing the multilayer reflective film 21, an Ru protective film 22 (film thickness: 2.5 nm) was deposited by ion beam sputtering on the multilayer reflective film 21 in continuation therefrom to obtain the substrate with the substrate with a multilayer reflective film 20. When depositing the Ru protective film 22 by ion beam sputtering, the incident angle of Ru sputtered particles relative to the normal of a main surface of the substrate was 40 degrees and the ion source gas flow rate was 8 sccm.

Fabrication of Multilayer Reflective Film of Comparative Example 1

Deposition of the multilayer reflective film 21 of Comparative Example 1 was carried out in the manner indicated below. Namely, a Mo layer (thickness: 2.8 nm) and a Si layer (thickness: 4.2 nm) were alternately laminated by ion beam sputtering using a Mo target and Si target (number of laminated pairs: 40) to form the multilayer reflective film 21 on the aforementioned glass substrate. The incident angle of sputtered Mo and Si particles relative to the normal of the glass substrate in ion beam sputtering was 50 degrees for Mo and 40 degrees for Si, respectively, and ion source gas flow rate was 8 sccm. Moreover, a Ru protective film 22 (film thickness: 2.5 nm) was deposited on the multilayer reflective film 21 to obtain the substrate with a multilayer reflective film 20.

After depositing the multilayer reflective film 21 in the same manner as Examples 1 and 2, an Ru protective film 22 (film thickness: 2.5 nm) was deposited by ion beam sputtering on the multilayer reflective film 21 in continuation therefrom to obtain the substrate with the substrate with a multilayer reflective film 20. When depositing the Ru protective film 22 by ion beam sputtering, the incident angle of Ru sputtered particles relative to the normal of a main surface of the substrate was 40 degrees and the ion source gas flow rate was 8 sccm.

<Measurement With Atomic Force Microscope>

Regions measuring 1 μm×1 μm and 3 μm×3 μm at arbitrary locations in the transfer pattern formation region (and more specifically, in the center of the transfer pattern formation region, 132 mm×132 mm) were measured with an atomic force microscope on the surfaces of the substrates with a multilayer reflective film 20 obtained in Examples 1 and 2 and Comparative Example 1. Tables 1 and 2 indicate surface roughness (root mean square roughness, RMS) obtained by measuring with an atomic force microscope, and the maximum and minimum values of power spectrum density (PSD) over a prescribed spatial frequency range as determined by power spectrum analysis of surface roughness. Moreover, Table 1 indicates the integrated value I of power spectrum density (PSD) at a spatial frequency of 10 $\mu m^{-1}$ to 100 $\mu m^{-1}$ when using a 1 $\mu m \times 1$ $\mu m$ region for the measured region. In addition, Table 2 indicates the integrated value I of power spectrum density (PSD) at a spatial frequency of 1 $\mu m^{-1}$ to 10 $\mu m^{-1}$ and a spatial frequency of 1 $\mu m^{-1}$ to 5 $\mu m^{-1}$ when using a 3 $\mu m \times 3$ $\mu m$ region for the measured region.

TABLE 1

| | | | Example 1 | Example 2 | Comparative Example 1 |
|---|---|---|---|---|---|
| | AFM Measured Region | | 1 $\mu m \times$ 1 $\mu m$ | 1 $\mu m \times$ 1 $\mu m$ | 1 $\mu m \times$ 1 $\mu m$ |
| PSD | Spatial frequency | Maximum value (nm$^4$) | 13.74 | 20.11 | 23.78 |
| | 1 $\mu m^{-1}$ to 10 $\mu m^{-1}$ | Minimum value (nm$^4$) | 3.81 | 7.40 | 6.92 |
| | Spatial frequency | Maximum value (nm$^4$) | 6.22 | 7.54 | 9.20 |
| | 10 $\mu m^{-1}$ to 100 $\mu m^{-1}$ | Minimum value (nm$^4$) | 0.31 | 0.32 | 0.34 |
| | Integrated value I ($\times 10^{-3}$ nm$^3$) | Integrated region: 10 $\mu m^{-1}$ to 100 $\mu m^{-1}$ | 125.21 | 144.95 | 183.09 |
| | RMS (nm) | | 0.117 | 0.134 | 0.173 |
| | No. of defects detected | | 1240 | 576 | 58323 |

TABLE 2

| | | | Example 1 | Example 2 | Comparative Example 1 |
|---|---|---|---|---|---|
| | AFM Measured Region | | 3 $\mu m \times$ 3 $\mu m$ | 3 $\mu m \times$ 3 $\mu m$ | 3 $\mu m \times$ 3 $\mu m$ |
| PSD | Spatial frequency | Maximum value (nm$^4$) | 36.34 | 32.40 | 55.66 |
| | 1 $\mu m^{-1}$ to 10 $\mu m^{-1}$ | Minimum value (nm$^4$) | 12.09 | 8.79 | 12.40 |
| | Integrated value I ($\times 10^{-3}$ nm$^3$) | Integrated region: 1 $\mu m^{-1}$ to 10 $\mu m-1$ | 163.12 | 150.51 | 193.82 |
| | | Integrated region: 1 $\mu m^{-1}$ to 5 $\mu m^{-1}$ | 101.43 | 93.27 | 117.25 |
| | RMS (nm) | | 0.126 | 0.130 | 0.170 |
| | No. of defects detected | | 1240 | 576 | 58323 |

Figure 5:
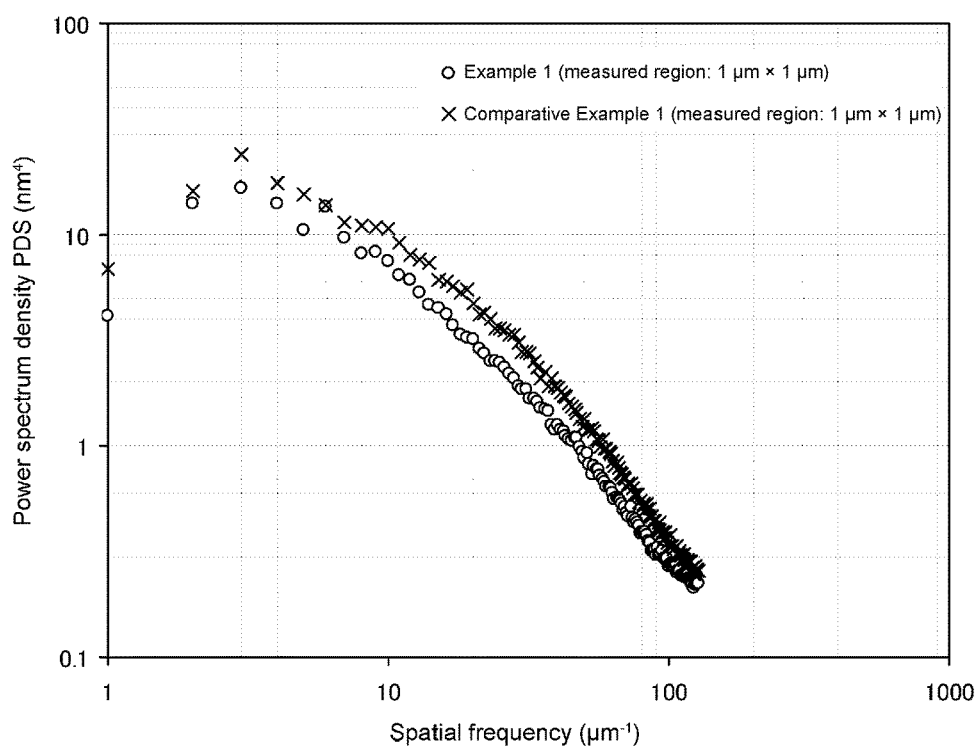
FIG. 5 is a graph indicating the results of analyzing the power spectra of the surfaces of substrates with a multilayer reflective film of an Example 1 and Comparative Example 1 of the present invention, and indicates the power spectrum densities (PSD) at spatial frequencies obtained by measuring a region measuring 1 μm×1 μm with an atomic force microscope.
Figure 6:
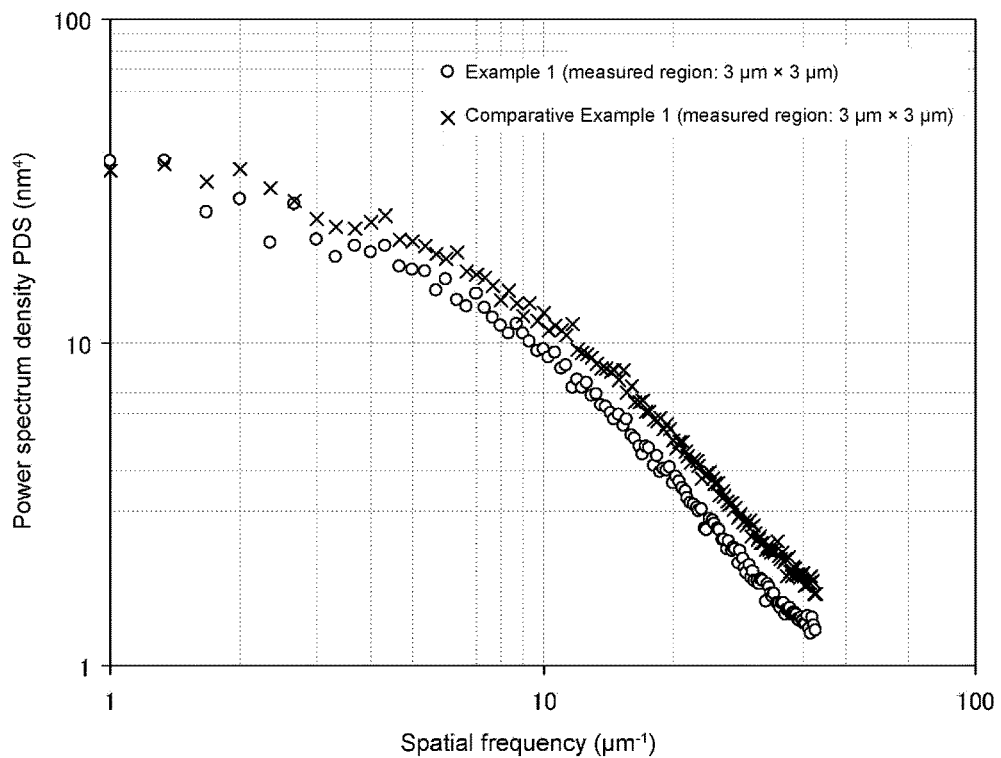
FIG. 6 is a graph indicating the results of analyzing the power spectra of the surfaces of substrates with a multilayer reflective film of an Example 1 and Comparative Example 1 of the present invention, and indicates the power spectrum densities (PSD) at spatial frequencies obtained by measuring a region measuring 3 μm×3 μm with an atomic force microscope.

For reference purposes, FIGS. 5 and 6 indicate the results of analyzing the power spectra of Example 1 and Comparative Example 1. FIGS. 5 and 6 indicate the power spectrum density (PSD) at each spatial frequency obtained by measuring regions measuring 1 $\mu m \times 1$ $\mu m$ and 3 $\mu m \times 3$ $\mu m$, respectively, with an atomic force microscope. In addition, FIG. 8 indicates the results of subjecting the data shown in FIG. 5 corresponding to a spatial frequency of 10 $\mu m^{-1}$ to 100 $\mu m^{-1}$ to power approximation. In addition, FIG. 7 indicates the results of subjecting the data shown in FIG. 6 corresponding to a spatial frequency of 1 $\mu m^{-1}$ to 10 $\mu m^{-1}$ to power approximation. The power approximation curves are in the form of $y = a \cdot x^b$ (wherein, a and b are constants), and becomes a straight line on a double-logarithmic graph. On a double-logarithmic graph, the exponent b of x is the slope of a straight line corresponding to the power approximation curve.

As shown in Table 1, the integrated value I of power spectrum density (PSD) at a spatial frequency of 10 $\mu m^{-1}$ to 100 $\mu m^{-1}$ obtained by measuring a 1 $\mu m \times 1$ $\mu m$ region of the surface of the substrate with a multilayer reflective film 20 of Examples 1 and 2 with an atomic force microscope was not more than $150 \times 10^{-3}$ nm$^3$, and the maximum value of power spectrum density (PSD) at a spatial frequency of 10 $\mu m^{-1}$ to 100 $\mu m^{-1}$ was not more than 9 nm$^4$. In contrast, the integrated value I of power spectrum density (PSD) at a spatial frequency of 10 $\mu m^{-1}$ to 100 $\mu m^{-1}$ obtained by measuring a 1 $\mu m \times 1$ $\mu m$ region of the surface of the substrate with a multilayer reflective film 20 of Comparative Example 1 with an atomic force microscope was $183.09 \times 10^{-3}$ nm$^3$, and the maximum value of power spectrum density (PSD) at a spatial frequency of 10 $\mu m^{-1}$ to 100 $\mu m^{-1}$ was 9.2 nm$^4$.

Figure 8:
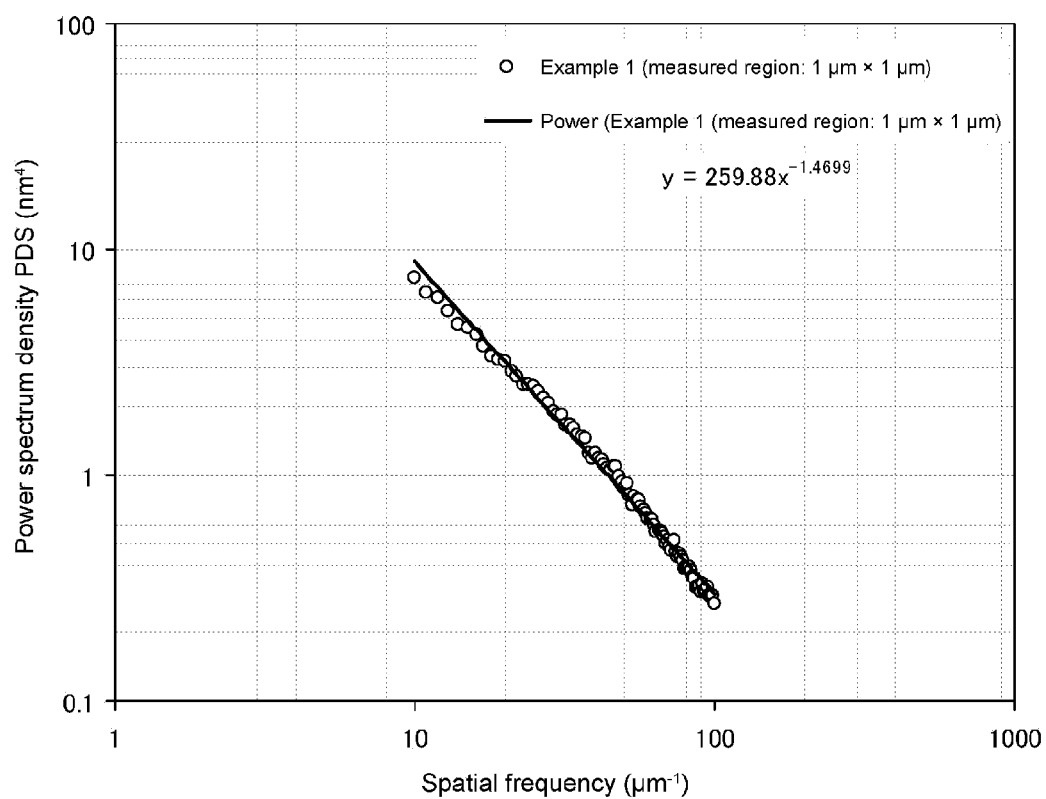
FIG. 8 indicates the results of subjecting the data shown in FIG. 5 to power approximation over a spatial frequency of 10 μm$^{-1}$ to 100 μm$^{-1}$.

As shown in FIG. 8, the value of b, which is the slope of the power approximation curve (straight line) of the aforementioned power spectrum density at a spatial frequency of 10 $\mu m^{-1}$ to 100 $\mu m^{-1}$ obtained by measuring a 1 $\mu m \times 1$ $\mu m$ region of Example 1 with an atomic force microscope, is a negative value. Thus, the power spectrum density (PSD) at a spatial frequency of 10 $\mu m^{-1}$ to 100 $\mu m^{-1}$ obtained by measuring a 1 $\mu m \times 1$ $\mu m$ region of Example 1 with an atomic force microscope clearly has the characteristic of an overall monotonic decrease.

As shown in Table 2, the integrated value I of power spectrum density (PSD) at a spatial frequency of 1 $\mu m^{-1}$ to 10 $\mu m^{-1}$ obtained by measuring a 3 $\mu m \times 3$ $\mu m$ region of the surface of the substrate with a multilayer reflective film 20 of Examples 1 and 2 with an atomic force microscope was not more than $180 \times 10^{-3}$ nm$^3$, and the maximum value of power spectrum density (PSD) at a spatial frequency of 1 $\mu m^{-1}$ to 10 $\mu m^{-1}$ was not more than 50 nm$^4$. In contrast, the integrated value I of power spectrum density (PSD) at a spatial frequency of 1 $\mu m^{-1}$ to 10 $\mu m^{-1}$ obtained by measuring a 3 $\mu m \times 3$ $\mu m$ region of the surface of the substrate with a multilayer reflective film 20 of Comparative Example 1 with an atomic force microscope was $193.82 \times 10^{-3}$ nm$^3$, and the maximum value of power spectrum density (PSD) at a spatial frequency of 1 $\mu m^{-1}$ to 10 $\mu m^{-1}$ was 55.66 nm$^4$.

As shown in FIG. 7, the value of b, which is the slope of the power approximation curve (straight line) of the aforementioned power spectrum density at a spatial frequency of 1 $\mu m^{-1}$ to 10 $\mu m^{-1}$ obtained by measuring a 3 $\mu m \times 3$ $\mu m$ region of Example 1 with an atomic force microscope, is a negative value. Thus, the power spectrum density (PSD) at a spatial frequency of 1 $\mu m^{-1}$ to 10 $\mu m^{-1}$ obtained by measuring a 3 µm×3 µm region of Example 1 with an atomic force microscope clearly has the characteristic of an overall monotonic decrease.

Regions measuring 132 mm×132 mm on the surface of the substrate with a multilayer reflective film 20 of Examples 1 and 2 and Comparative Example 1 (surface of Ru protective film 22) were inspected for defects under inspection sensitivity conditions enabling detection of defects having a sphere equivalent volume diameter (SEVD) of 21.5 nm using a highly sensitive defect inspection apparatus having an inspection light source wavelength of 193 nm ("Teron 610" manufactured by KLA-Tencor Corp.). Furthermore, sphere equivalent volume diameter (SEVD) can be calculated according to the equation: $SEVD=2(3S/4\pi h)^{1/3}$, where (S) is defined as the defect area and (h) is defined as the defect height. The defect area (S) and defect height (h) can be measured with an atomic force microscope (AFM).

Tables 1 and 2 indicate the number of defects detected, including pseudo defects, in the surface of the substrates with a multilayer reflective film 20 of Examples 1 and 2 and Comparative Example 1 as determined by measuring SEVD. The maximum total number of defects detected in Examples 1 and 2 was 1,240 (Example 1), indicating that the number of pseudo defects was significantly inhibited in comparison with the more than 50,000 defects conventionally detected. A total of about 2,000 detected defects means that the presence or absence of contaminants, scratches and other critical defects can be inspected easily. In contrast, the number of defects detected in Comparative Example 1 was 58,323, indicating that inspections were unable to be carried out for the presence or absence of contaminants, scratches or other critical defects.

Moreover, the number of defects, including pseudo defects, detected was investigated when defect inspections were carried out under different inspection sensitivity conditions on the surface of the substrates with a multilayer reflective film 20 of Examples 1 and 2 and Comparative Example 1. Those results are shown in Table 3.

TABLE 3

| Inspection sensitivity conditions | | Example 1 | Example 2 | Comparative Example 1 |
|---|---|---|---|---|
| No. of defects detected | >21 nm | 1240 | 576 | 58323 |
| | >23 nm | 89 | 52 | 15211 |
| | >25 nm | 48 | 34 | 98 |
| | >34 nm | 16 | 9 | 31 |

Furthermore, the inspection sensitivity conditions shown in Table 3 represent sensitivity conditions enabling inspection for defects having a size of 21.5 nm in terms of SEVD (>21 nm), sensitivity conditions enabling inspection for defects having a size of 23 nm (>23 nm), sensitivity conditions enabling inspection for defects having a size of 25 nm (>25 nm), and sensitivity conditions enabling inspection for defects having a size of 34 nm (>34 nm).

As shown in Table 3, the number of defects detected in Examples 1 and 2 was not more than 100 under any of the sensitivity conditions enabling inspection for detects having a size of 23 nm, 25 nm or 34 nm, and the presence or absence of contaminants, scratches or other critical defects was able to be easily inspected. In contrast, because the number of defects detected exceeded 50,000 in Comparative Example 1 under sensitivity conditions enabling inspection for defects having a size of 21.5 nm and exceeded 15,000 under sensitivity conditions enabling inspection for defects having a size of 23 nm, it was difficult to inspect for the presence or absence of contaminants, scratches or other critical defects at multiple inspection sensitivities.

In addition, as a result of inspecting regions measuring 132 mm×132 mm on the surface of the multilayer reflective film 21 of Examples 1 and 2 for detects using a highly sensitive defect inspection apparatus having an inspection light source wavelength of 266 nm ("MAGICS M7360" manufactured by Lasertec Corp.) and a highly sensitive defect inspection apparatus having an inspection light source wavelength of 13.5 nm, there were few defects detected and it was possible to inspect for critical defects. Furthermore, defect inspections were carried out under the maximum inspection sensitivity conditions when using the highly sensitive defect inspection apparatus having an inspection light source wavelength of 266 nm ("MAGICS M7360" manufactured by Lasertec Corp.), and under inspection sensitivity conditions enabling detection of defects having a sphere equivalent volume diameter of 20 nm when using the highly sensitive defect inspection apparatus having an inspection light source wavelength of 13.5 nm.

Furthermore, fiducial marks for managing coordinates of the locations of the aforementioned defects were formed with a focused ion beam at 4 locations outside the transfer pattern formation region (132 mm×132 mm) on the protective film 22 and the multilayer reflective film 21 of the substrates with a multilayer reflective film 20 used in Examples 1 and 2 and Comparative Example 1.

Fabrication of Reflective Mask Blanks 30 for EUV Exposure of Examples 1 and 2 and Comparative Example 1

The back side electrically conductive film 23 was formed by DC magnetron sputtering on the back side of the substrate with a multilayer reflective film 20 of the previously described Examples 1 and 2 and Comparative Example 1 where the multilayer reflective film 21 was not formed. This back side electrically conductive film 23 was formed by reactive sputtering in an atmosphere of Ar gas and $N_2$ gas ($Ar:N_2=90\%:10\%$) with a Cr target opposing the back side of the substrate with a multilayer reflective film 20. Measurement of the elementary composition of the back side electrically conductive film 23 by Rutherford back scattering analysis yielded values of 90 at % for Cr and 10 at % for N. In addition, the film thickness of the back side electrically conductive film 23 was 20 nm.

Moreover, the absorber film 24 composed of a TaBN film was formed by DC magnetron sputtering on the surface of the protective film 22 of the substrate with a multilayer reflective film 20 of the aforementioned Examples 1 and 2 and Comparative Example 1 to fabricate the reflective mask blank 30. The absorber film 24 was formed by reactive sputtering in an atmosphere of Xe gas and $N_2$ gas ($Xe:N_2=90\%:10\%$) with the protective film 22 of the substrate with a multilayer reflective film 20 opposing a TaB target (Ta:B=80:20, atomic ratio). Measurement of the elementary composition of the absorber film 24 by Rutherford back scattering analysis yielded values of 80 at % for Ta, 10 at % for B and 10 at % for N. In addition, the film thickness of the absorber film 24 was 65 nm. Furthermore, measurement of the crystal structure of the absorber film 24 with an X-ray diffraction (XRD) analyzer indicated it to have an amorphous structure.

When the surface of the reflective mask blank 30 obtained according to the aforementioned fabrication method was inspected for defects ("MAGICS 1350" manufactured by Lasertec Corp.), only three defects were detected, indicating that a favorable reflective mask blank was obtained.

Fabrication of Reflective Mask Blanks 30 of Examples 3 and 4 and Comparative Example 2

The reflective mask blanks 30 of Examples 3 and 4 were fabricated by depositing the absorber films 24 shown in Table 4 on the surface of the substrate with a multilayer reflective film 20 (surface of Ru protective film 22) of the aforementioned Example 2. More specifically, the absorber film 24 was formed by laminating a tantalum nitride film (TaN film) and a chromium carboxonitride film (CrCON film) by DC sputtering. The TaN films were formed in the manner indicated below. Namely, TaN films (Ta: 85 at %, N: 15 at %) having the film thicknesses described in Table 4 were formed by reactive sputtering in a mixed gas atmosphere of Ar gas and $N_2$ gas using a tantalum target. The CrCON films were formed in the manner indicated below. Namely, CrCON films (Cr: 45 at %, C: 10 at %, O: 35 at %, N: 10 at %) having the film thicknesses described in Table 4 were formed by reactive sputtering in a mixed gas atmosphere of Ar gas, $CO_2$ gas and $N_2$ gas using a chromium target. Moreover, similar to Example 2, the reflective mask blanks 30 of Examples 3 and 4 were fabricated by depositing the back side electrically conductive film 23 on the back side of the mask blank substrate 10.

On the other hand, the reflective mask blank 30 of Comparative Example 2 was fabricated by depositing the absorber films 24 shown in Table 4 on the surface (surface of Ru protective film 22) of the substrate with a multilayer reflective film 20 of the aforementioned Example 2. More specifically, TaN films (Ta: 92 at %, N: 8 at %) having the film thicknesses described in Table 4 were formed by reactive sputtering in a mixed gas atmosphere of Ar gas and $N_2$ gas using a tantalum target by DC sputtering.

Regions measuring 3 μm×3 μm at an arbitrary location (and more specifically, in the center of the transfer pattern formation region) of the transfer pattern formation region (132 mm×132 mm) were measured with an atomic force microscope for the surface (surface of the absorber film 24) of the reflective mask blanks 30 of Examples 3 and 4 and Comparative Example 2. Table 4 indicates the maximum values of surface roughness (root mean square roughness: RMS) obtained by measuring with an atomic force microscope, power spectrum density (PSD) at a spatial frequency of 1 $μm^{-1}$ to 10 $μm^{-1}$ as determined by power spectrum analysis of surface roughness, and the integrated value I of power spectrum density (PSD) at a spatial frequency of 1 $μm^{-1}$ to 10 $μm^{-1}$.

TABLE 4

| | Example 3 | Example 4 | Comparative Example 2 |
|---|---|---|---|
| Absorber film lower layer (film thickness) | TaN (54.3 nm) | TaN (48.9 nm) | TaN (85 nm) |
| Absorber film upper layer (film thickness) | CrCON (5 nm) | CrCON (10 nm) | — |
| Absorber film total thickness (nm) | 59.3 | 58.9 | 85 |
| RMS (nm) | 0.24 | 0.24 | 0.46 |
| Maximum value of PSD ($nm^4$) | 28.9 | 44.4 | 52.1 |
| Integrated value of PSD ($×10^{-3}$ $nm^3$) | 433.2 | 467.9 | 939.5 |

As shown in Table 4, the integrated values I of power spectrum density (PSD) at a spatial frequency of 1 $μm^{-1}$ to 10 $μm^{-1}$ obtained by measuring a region measuring 3 μm×3 μm on the surface of the reflective mask blanks 30 of Examples 3 and 4 with an atomic force microscope were not more than 800×$10^{-3}$ $nm^3$ (and more specifically, not more than 500×$10^{-3}$ $nm^3$), and the maximum values of power spectrum density (PSD) at a spatial frequency of 1 $μm^{-1}$ to 10 $μm^{-1}$ were not more than 50 $nm^4$. In contrast, the integrated value I of power spectrum density (PSD) at a spatial frequency of 1 $μm^{-1}$ to 10 $μm^{-1}$ obtained by measuring a region measuring 3 μm×3 μm on the surface of the reflective mask blank 30 of Comparative Example 2 with an atomic force microscope exceeded 800×$10^{-3}$ $nm^3$ at 939.5× $10^{-3}$ $nm^3$, and the maximum value of power spectrum density (PSD) at a spatial frequency of 1 $μm^{-1}$ to 10 $μm^{-1}$ exceeded 50 $nm^4$ at 52.1 $nm^4$.

Next, the number of defects, including pseudo defects, detected was investigated when defect inspections were carried out on the surface of the reflective mask blanks 30 of Examples 3 and 4 and Comparative Example 2 under different inspection sensitivity conditions. The results are shown in Table 5.

TABLE 5

| | Inspection sensitivity conditions | Example 3 | Example 4 | Comparative Example 2 |
|---|---|---|---|---|
| No. of defects detected | >21 nm | 6254 | 10094 | 69950 |
| | >23 nm | 2318 | 5001 | 23144 |
| | >25 nm | 82 | 112 | 220 |
| | >34 nm | 28 | 37 | 65 |

Furthermore, the inspection sensitivity conditions shown in Table 5 represent sensitivity conditions enabling inspection for defects having a size of 21.5 nm in terms of sphere equivalent volume diameter (SEVD) (>21 nm), sensitivity conditions enabling inspection for defects having a size of 23 nm (>23 nm), sensitivity conditions enabling inspection for defects having a size of 25 nm (>25 nm), and sensitivity conditions enabling inspection for defects having a size of 34 nm (>34 nm).

As shown in Table 5, the number of defects detected in Examples 3 and 4 was not more than 15,000 under any of the sensitivity conditions enabling inspection for defects having a size of 23 nm, 25 nm or 34 nm, and the presence or absence of contaminants, scratches or other critical defects was able to be easily inspected. In contrast, because the number of defects detected exceeded 50,000 in Comparative Example 2 under sensitivity conditions enabling inspection for defects having a size of 21.5 nm and exceeded 20,000 under sensitivity conditions enabling inspection for defects having a size of 23 nm, it was difficult to inspect for the presence or absence of contaminants, scratches or other critical defects.

<Fabrication of Reflective Mask 40>

The surface of the absorber film 24 of the reflective mask blanks 30 of Examples 1 to 4 and Comparative Examples 1 and 2 was coated with resist by spin coating and a resist film having a film thickness of 150 nm was deposited thereon after going through heating and cooling steps. Next, a resist pattern was formed by going through desired pattern drawing and developing steps. The absorber film 24 was patterned by a prescribed dry etching using the resist pattern as a mask to form the absorber pattern 27 on the protective film 22. Furthermore, when the absorber film 24 consists of a TaBN film and TaN film, dry etching can be carried out with a mixed gas of $Cl_2$ and He. In addition, when the absorber film 24 consists of a CrCON film, dry etching can be carried out with a mixed gas of chlorine ($Cl_2$) and oxygen ($O_2$) (mixing ratio (flow rate ratio) of chlorine ($Cl_2$) to oxygen ($O_2$)=8:2).

Subsequently, the resist film was removed followed by chemical cleaning in the same manner as previously described to fabricate the reflective masks 40 of Examples 1 to 4 and Comparative Examples 1 and 2. Furthermore, the reflective masks 40 were fabricated after correcting drawing data in the aforementioned drawing step so that the absorber pattern 27 was arranged at locations where critical defects are present based on defect data and transferred pattern (circuit pattern) data generated based on the aforementioned fiduciary marks. Defect inspections were carried out on the resulting reflective masks 40 of Examples 1 to 4 and Comparative Examples 1 and 2 using a highly sensitive defect inspection apparatus ("Teron 610" manufactured by KLA-Tencor Corp.).

Defects were not confirmed during measurement with the highly sensitive defect inspection apparatus in the case of the reflective masks 40 of Examples 1 to 4. In contrast, in the case of the reflective masks 40 of Comparative Examples 1 and 2, a large number of defects were detected during measurement with the highly sensitive defect inspection apparatus.

<Method of Manufacturing Semiconductor Device>

Next, when semiconductor devices were fabricated using the reflective masks 40 of the aforementioned Examples 1 to 4 and carrying out pattern transfer on a resist film on a transferred substrate in the form of a semiconductor substrate using an exposure apparatus followed by patterning an interconnection layer, semiconductor devices were able to be fabricated that were free of pattern defects.

Furthermore, in fabricating the above described substrate with a multilayer reflective film 20 and the reflective mask blank 30, although the multilayer reflective film 21 and the protective film 22 were deposited on a main surface of the mask blank substrate 10 on the side where a transfer pattern is formed, followed by forming the back side electrically conductive film 23 on the opposite side from the aforementioned main surface, fabrication is not limited to this sequence. The reflective mask blank 30 may also be fabricated by forming the back side electrically conductive film 23 on a main surface of the mask blank substrate 10 on the opposite side from the main surface on the side on which a transfer pattern is formed, followed by depositing the multilayer reflective film 21 and the protective film 22 on the main surface on the side where the transfer pattern is formed. In this case, the substrate with a multilayer reflective film 20 can be fabricated by further depositing the protective film 22 on the surface of the multilayer reflective film 21. Moreover, the reflective mask blank 30 can be fabricated by depositing the absorber film 24 on the multilayer reflective film 21 or the protective film 22 of the substrate with a multilayer reflective film 20.

BRIEF DESCRIPTION OF THE REFERENCE SYMBOLS

10 Mask blank substrate
20 Substrate with a multilayer reflective film
21 Multilayer reflective film
22 Protective film
23 Back side electrically conductive film
24 Absorber film
27 Absorber pattern
30 Reflective mask blank
40 Reflective mask
100 CARE processing apparatus
124 Treatment tank
126 Catalyst surface plate
128 Glass substrate (processing target)
130 Substrate holder
132 Rotating shaft
140 Base
142 Platinum
170 Heater
172 Heat exchanger
174 Treatment liquid supply nozzle
176 Fluid flow path

The invention claimed is:

1. A mask blank substrate used in lithography; wherein, a power spectrum density (PSD) at a spatial frequency of 1 $\mu m^{-1}$ to 10 $\mu m^{-1}$ of a main surface, on which a transfer pattern is formed, of the mask blank substrate, obtained by measuring a region measuring 3 $\mu m \times 3$ $\mu m$ with an atomic force microscope, is not more than 30 $nm^4$, and an integrated value I of the power spectrum density (PSD) is not more than $100 \times 10^{-3}$ $nm^3$.

2. The mask blank substrate according to claim 1, wherein the power spectrum density (PSD) is 1 $nm^4$ to 25 $nm^4$.

3. The mask blank substrate according to claim 1, wherein the main surface is processed by catalyst-referred etching.

4. The mask blank substrate according to claim 1, wherein the mask blank substrate is used in EUV lithography.

5. A substrate with a multilayer reflective film, comprising the multilayer reflective film obtained by alternately laminating a high refractive index layer and a low refractive index layer on or above the main surface of the mask blank substrate according to claim 1.

6. The substrate with the multilayer reflective film according to claim 5, wherein a protective film is provided on or above the multilayer reflective film.

7. A reflective mask blank, comprising an absorber film serving as the transfer pattern on or above the substrate with the multilayer reflective film according to claim 5.

8. A reflective mask, comprising an absorber pattern on or above the substrate with the multilayer reflective film by patterning the absorber film in the reflective mask blank according to claim 7.

9. A method of manufacturing a semiconductor device comprising forming a transfer pattern, based on the absorber pattern, on or above a transferred substrate by carrying out a lithography process with an exposure apparatus using the reflective mask according to claim 8.

* * * * *